US009083288B2

(12) United States Patent
Thomsen et al.

(10) Patent No.: US 9,083,288 B2
(45) Date of Patent: Jul. 14, 2015

(54) HIGH LEVEL CAPABLE AUDIO AMPLIFICATION CIRCUIT

(75) Inventors: Henrik Thomsen, Holte (DK); Jens Jorgen Gaarde Henriksen, Charlottenlund (DK); Claus Furst, Roskilde (DK)

(73) Assignee: INVENSENSE, INC., San Jose, CA (US)

( * ) Notice: Subject to any disclaimer, the term of this patent is extended or adjusted under 35 U.S.C. 154(b) by 436 days.

(21) Appl. No.: 12/795,072

(22) Filed: Jun. 7, 2010

(65) Prior Publication Data

US 2011/0026739 A1 Feb. 3, 2011

Related U.S. Application Data

(60) Provisional application No. 61/186,056, filed on Jun. 11, 2009, provisional application No. 61/243,240, filed on Sep. 17, 2009, provisional application No. 61/243,221, filed on Sep. 17, 2009.

(51) Int. Cl.
*H03F 1/32* (2006.01)
*H03F 3/68* (2006.01)
*H03F 3/45* (2006.01)
(Continued)

(52) U.S. Cl.
CPC .............. *H03F 3/187* (2013.01); *H03F 1/3211* (2013.01); *H03F 3/45475* (2013.01); *H03F 3/68* (2013.01); *H03F 2200/03* (2013.01); *H03F 2200/331* (2013.01); *H03F 2203/45138* (2013.01); *H03F 2203/45552* (2013.01); *H03F 2203/45571* (2013.01); *H03F 2203/45586* (2013.01); *H03G 3/30* (2013.01); *H04R 3/00* (2013.01);

(Continued)

(58) Field of Classification Search
CPC . H03G 3/3026; H03G 3/3089; H03G 3/3078; H03G 3/3052; H03G 3/3005; H03G 3/32; H03G 7/002; H03G 7/007; H03G 7/06; H03F 3/187; H03F 3/18; H03F 3/195; H03F 3/45475; H03F 1/3211; H03F 2200/03; H03F 2200/331; H03F 2203/45138; H03F 2203/45552; H03F 2203/45571; H03F 2200/294
USPC ......... 381/111–115, 120, 121, 26, 28; 700/94
See application file for complete search history.

(56) References Cited

U.S. PATENT DOCUMENTS 4,002,859 A * 1/1977 Schoeps et al. ............... 381/113
5,999,802 A 12/1999 Aschwanden
(Continued)

OTHER PUBLICATIONS

Wolfson Microelectronics Product Sheet WM8737L, "Stereo ADC with Microphone Preamplifier" (Apr. 2009) 39 pages.
(Continued)

*Primary Examiner* — Ping Lee
(74) *Attorney, Agent, or Firm* — Maryam Imam; IPxLaw Group LLP

(57) ABSTRACT

The present invention relates to an audio amplification circuit with first and second signal channels which generate first and second digital audio signals with different signal amplifications from a common audio input signal and a method of amplifying a common audio input signal with different signal amplifications to provide first and second digital audio signals with different amplification. The audio amplification circuit is particularly well-adapted for cooperating with an external or integral audio signal controller configured for receipt and processing of the first and second digital audio signals.

31 Claims, 8 Drawing Sheets

(51) Int. Cl.
  *H03F 3/187* (2006.01)
  *H04R 3/00* (2006.01)
  *H04R 19/00* (2006.01)
  *H03G 3/30* (2006.01)

(52) U.S. Cl.
  CPC ............ *H04R19/00* (2013.01); *H04R 2460/03* (2013.01); *H04R 2499/11* (2013.01)

(56) References Cited

U.S. PATENT DOCUMENTS

| | | |
|---|---|---|
| 6,271,780 B1 | 8/2001 | Gong et al. |
| 7,049,988 B1 * | 5/2006 | Duewer et al. ................ 341/123 |
| 7,221,766 B2 * | 5/2007 | Boor .............................. 381/111 |
| 7,630,504 B2 * | 12/2009 | Poulsen ......................... 381/111 |
| 2002/0137505 A1 * | 9/2002 | Eiche et al. ................... 455/425 |
| 2007/0103355 A1 | 5/2007 | Yamada |
| 2008/0171540 A1 * | 7/2008 | Beadle et al. ................. 455/418 |
| 2010/0183167 A1 | 7/2010 | Phelps et al. |
| 2012/0250884 A1 | 10/2012 | Phelps et al. |

OTHER PUBLICATIONS

Tani et al., "20 Bit A-to-D & D-to-A Converting Systems for Digital Audio," IEEE Transactions on Consumer Electronics 35(3) (Aug. 1989), pp. 528-535.

\* cited by examiner

HIGH LEVEL CAPABLE AUDIO AMPLIFICATION CIRCUIT

The present invention relates to an audio amplification circuit with first and second signal channels which generate first and second digital audio signals, respectively, with different signal amplifications based on a common audio input signal. The invention also relates to a method of amplifying a common audio input signal with different signal amplifications to provide first and second digital audio signals with different amplification. The audio amplification circuit and amplification methodology is particularly well-adapted for cooperating with an external or integral audio signal controller configured for receipt and processing of the first and second digital audio signals.

BACKGROUND OF THE INVENTION

Acceptable handling of audio signals with very large dynamic range presents significant challenges to audio amplification and processing circuits and systems, in particular for audio amplification and processing circuits targeted for portable devices and applications such as mobile terminals, hearing instruments, headsets, sound recording cameras etc.

Since portable devices are powered from battery sources severe constraints as to a maximum acceptable power consumption of the audio amplification circuit is typically imposed. To further worsen the situation, there typically exist similar constraints on a maximum DC supply voltage that can be provided to the audio amplification and processing circuitry. The audio amplification and processing or conditioning circuitry often comprise preamplifiers, analogue-to-digital converters, active filters, voltage supply regulators, etc. The maximum DC power supply voltage, and therefore AC signal voltage swing, will often be limited to a voltage below a maximum rated voltage of the particular semiconductor process used to implement the signal processing or conditioning circuitry on. Furthermore, a continuing trend of shrinking minimum feature sizes of active devices on semiconductor dies and circuits in general and CMOS processes in particular, leads to a constant decline of the maximum DC power supply voltage these active devices can withstand or tolerate. Audio amplification systems and circuitry, such as audio signal controllers and audio amplification circuits, which can operate on these declining DC power supply voltages without audio performance degradation, are therefore highly advantageous. It is generally unacceptable to reduce performance of the audio amplification system, for example by lowering dynamic range or amplification of a preamplifier, to accommodate large audio input signals despite the decrease of the DC power supply voltage. The DC power supply voltage may be less than 2 Volt or even less than 1.5 Volt. The audio amplification system should therefore be able to provide unimpaired audio quality for low level signals and high level signals at the decreased or lowered DC power supply voltage.

An important application of the present audio amplification circuit is to amplify and digitize audio signals in miniature microphones where microphone transducer elements are capable of generating audio input signals with very large dynamic range. The microphone transducer elements may comprise a capacitive electret or condenser transducer of a miniature ECM, that is capable of handling very high sound pressure levels and generate correspondingly large transducer signals without significant distortion. These very high sound pressure levels, for example peak sound pressure levels above 110, 120 or 130 dB SPL, can originate from different types of acoustic sources for example car door slamming, wind noise and augmented live music performances. However, prior art microphone amplification systems have not been capable of handling the entire dynamic range of these transducer signals in an entirely satisfactory manner, e.g., without increasing equivalent input noise of the miniature microphone or overloading the miniature microphone at large sound pressure levels or both.

Accordingly, there is a need in the art for microphone amplification circuits and systems capable of handling the entire dynamic range of the transducer signals generated by microphone transducer elements, or other audio source signals with large dynamic range, without excessive distortion or noise within the previously discussed constraints on DC power supply voltage and power consumption dictated by portable or battery-powered devices and applications.

PRIOR ART

In general, prior art microphone amplification circuits for miniature microphones have been designed to accommodate sound pressure levels up till a maximum limit around 110 dB SPL or lower where preamplifier non-linearity or clipping has limited further increase of microphone output voltage. This has been considered acceptable in view of the relatively rare occurrence of sound pressure levels above this maximum limit. To protect the microphone amplification circuit against excessively large transducer signals generated by large low-frequency sound pressures it has been practiced to introduce a highpass filter with a corner or cut-off frequency located between for example 100 Hz and 200 Hz in the microphone amplification circuit or by introducing an acoustical highpass filter in a microphone transducer element itself for example by means of an appropriately dimensioned hole in a diaphragm.

U.S. Pat. No. 6,271,780 describes a gain ranging A/D converter for microphone applications having two separate gain paths provided as a low-gain path and a high-gain path each including a preamplifier coupled to an analogue-to-digital converter to provide respective digital signals. The gain of the first and second preamplifiers differs with 24 dB. The gain ranging A/D converter furthermore comprises summing device performing a mixing or blending operation on the respective digital signals supplied by the low and high-gain paths. A proportionality device controls an amount of gain applied to each of the digital signals to be summed from the low and high-gain paths in accordance with a summing profile. The amount of gain of each of the digital signals to be summed is determined by comparing a level of the digital signal of the high-gain path to upper and lower preset thresholds.

The WM8737L Product Sheet describes a low power stereo audio ADC for portable applications. The left and right signal channels have separate microphone signal inputs and each signal channel comprises a gain programmable microphone preamplifier operatively coupled to an analogue-to-digital converter through a programmable gain amplifier (PGA). The gain of each PGA is logarithmically adjustable from −97 dB to +30 dB in 0.5 dB steps by writing appropriate values to a PGA gain control register. The stereo audio ADC comprises a zero-cross detector for each channel to, in one mode of operation, only change respective gains of the programmable microphone preamplifier and the PGA when the input signal of a channel is at zero.

SUMMARY OF THE INVENTION

According to a first aspect of the invention, there is provided an audio amplification circuit comprising an input terminal for receipt of an audio input signal. A first preamplifier has an input operatively coupled to the input terminal and an output operatively coupled to a first analogue-to-digital converter to provide a first digital audio signal with a first signal amplification. A second preamplifier has an input operatively coupled to the input terminal and an output operatively coupled to a second analogue-to-digital converter to provide a second digital audio signal with a second signal amplification. The second signal amplification is smaller than the first signal amplification.

In accordance with the invention, the first and second digital audio signals or digital audio streams are derived from a common input signal in form of the audio input signal to provide the first and second digital audio signals from respective ones of first and second signal channels or paths. The first signal amplification is defined as the gain between the first digital audio signal and the audio input signal and the second signal amplification as the gain between the second digital audio signal and the audio input signal. Since the second signal amplification is smaller than the first signal amplification, preferably significantly smaller, the output of the second analogue-to-digital (A/D) converter will be capable of handling higher levels of the audio input signal without distortion due to the lower output voltage level. This is naturally particularly pronounced if the first and second preamplifiers and A/D converters are of similar or identical design powered by essentially identical DC power supply voltages. This is a common situation because preamplifiers suitable for low-power operation are preferably constructed with rail-to-rail output voltage swing capability or at least an output voltage swing capability close thereto. To create an advantageous difference between the overload limits of the first and second parallel signal paths or channels, the second signal amplification may be at least 10 dB, preferably more than 20 dB, or more than 40 dB, smaller than the first signal amplification throughout a frequency range between 300 Hz and 3 kHz. This constraint may alternatively be defined at a single or at a few relevant reference frequencies inside the audio band between 20 Hz and 20 kHz, for example at 1 kHz or as an average determined over frequencies 300 Hz, 1 kHz and 3 kHz.

The first signal channel can often be considered a normal sensitivity channel well-adapted to amplify or process low levels and normal levels of the audio input signal without introducing unacceptable noise at small or zero audio input signal levels. The second signal channel is, due to its lower signal amplification, but preferably essentially same output voltage swing capability, capable of handling audio input signals with levels for example 10 dB or 20 dB larger than the first signal channel before the second signal channel reaches its overload or clipping limits. The overload or clipping limit of each of the first and the second signal channel may conveniently be defined as the signal level where the digital audio signal in question reaches a total harmonic distortion of 3% measured with a 1 kHz sine signal applied to the input terminal.

Some embodiments of the present audio amplification circuit may comprise one or more additional signal channels for example a third signal channel providing a third digital audio signal with a signal amplification in-between the first and second signal amplifications. An associated signal controller may in this situation be adapted to switch between these three different signal channels based on an estimated level of any-one of the first, second or third digital audio signals.

The input terminal is adapted for receipt of analogue audio input signals originating from various types of audio sources or generators such as recorded music and speech signals provided as line level signals supplied to the input terminal by a low impedance signal source. The audio input signal may alternatively be supplied by an electroacoustical audio transducer such as a microphone transducer element directly coupled to the input terminal. Naturally, the amplification circuit may comprise two parallel input terminals receiving the same audio input terminal. The microphone transducer element may comprise an electrodynamic transducer element or a capacitive electret or condenser transducer element of a miniature ECM which constitute an extremely large generator impedance corresponding to a capacitor with a value between 0.5 and 2 pF.

In a particular advantageous embodiment of the invention, an attenuator is operatively coupled in-between the input terminal of the audio amplification circuit and an input terminal of the second audio preamplifier. By an appropriate design of the attenuator it can significantly reduce the level of the audio input signal applied to the input terminal of the second preamplifier compared to the level on the input terminal. This leads to a beneficial shielding of input transistors or other active devices of the second preamplifier from peak audio signal voltages rising above or below DC power supply voltage rails of the second preamplifier. It is furthermore advantageous if the attenuator comprises a voltage divider formed by passive components such as a resistive or capacitive voltage divider since passive components are far better suited than active semiconductor devices, such as CMOS transistors, to handle very large levels of audio signal voltages in a linear manner.

The application of an attenuator based on a capacitive voltage divider is very useful in condenser microphone applications, for example miniature ECMs, because the substantially capacitive load presented by the capacitive voltage divider to a capacitive or condenser transducer element of the condenser microphone leads to a substantially frequency independent attenuation of a transducer signal. Furthermore, capacitors of the capacitive voltage do contribute with thermal noise to the audio input signal in contrast to a resistor based attenuator, in particular a high impedance attenuator required by the extremely large generator impedance of a condenser transducer element of a miniature ECM. In addition, appropriate capacitor values of the capacitors of the capacitive voltage divider can be formed on the integrated semiconductor substrate with minimal die area consumption and therefore at a low cost.

As mentioned above, the attenuator protects the input of the second preamplifier for being subjected to very large levels of the audio input signals so as to allow the second preamplifier to operate substantially linearly even at these large audio signal levels which may correspond to sound pressure levels above 110 or 120 dB SPL. A substantially linear operation, or at least quasi-linear operation in case of a build-in Automatic Gain Control function, of the second preamplifier across a desired dynamic range of the audio input signal ensures the second preamplifier responds rapidly and predictably to the large levels of the audio input signal. One advantage of this feature is that it is possible to obtain an accurate indication of the actual level of the audio input signal for use in an associated level estimator operating on the second digital audio signal.

A very useful embodiment of the present audio amplification circuit is specifically well-suited for use in condenser microphone applications where the generator impedance of a capacitive transducer element normally is very high which may lead to unwanted transducer signal attenuation or signal loss by the coupling to an audio amplification circuit unless appropriate impedance characteristics are provided at its input terminal. As mentioned above, condenser or capacitive transducers element or capsule of a miniature ECM suited for mobile terminal applications exhibits extremely high generator impedances essentially corresponding to purely capacitive generator impedances equivalent to a capacitor of 0.5 pF to 2 pF. Accordingly, this embodiment of the audio amplification circuit has an input impedance at the input terminal which is larger than 100 MΩ, preferably larger than 1 GΩ, even more preferably larger than 10 GΩ measured at 1 kHz. Input impedances in the above-mentioned preferred range can for example be accomplished by an appropriate choice of semiconductor process technology, such as MOS, CMOS or BiCMOS technology, and/or appropriate circuit design techniques. In one useful embodiment, which exhibits very large input impedance at the input terminal, respective input stages of the first and second preamplifiers are based on CMOS transistors.

Alternatively, requirements to the input impedance at the input terminal of the audio amplification circuit in applications involving electrical coupling to a capacitive transducer elements can be specified in terms of a capacitive component of the input impedance at the input terminal. The capacitive component of the input impedance at the input terminal is preferably smaller than 500 fF, preferably smaller than 200 fF, even more preferably smaller than 100 fF, measured at 1 kHz. If the audio amplification circuit comprises the previously-mentioned capacitive voltage divider, the above-mentioned advantageous ranges for the capacitive component of the input impedance at the input terminal can be complied with by appropriate selection of capacitances in the capacitive voltage divider. The capacitive voltage divider is particular advantageous for coupling to a miniature condenser transducer element since it provides frequency independent attenuation of the audio input signal supplied to the input terminal by a microphone transducer element. A capacitance of the smallest capacitor of the capacitive voltage divider is preferably less than 500 fF, or even more preferably less than 100 fF, to minimize loading of the audio input signal by providing large input impedance.

In one embodiment, the capacitive voltage divider comprises first and second cascaded capacitors coupled in-between the input terminal and a signal ground node such as circuit ground or a DC supply or DC reference voltage. A midpoint or leg between the first and second cascaded capacitors is operatively coupled to the input of the second preamplifier. The first and second capacitors values are selected to be around 100 fF and 900 fF, respectively, to provide approximately 20 dB of attenuation of the audio input signal before it reaches the input of the second preamplifier. The cascade of the first and second capacitors cooperate to introduce a capacitive load of around 90 fF on the input terminal.

The difference between the first and second signal amplifications may in some embodiments be created exclusively by a signal attenuation of the attenuator. This has the advantageous effect that the first and second preamplifiers may be of substantially identical design and therefore exhibit essentially identical small signal transfer functions across a predetermined frequency range of the audio spectrum for example between 100 Hz and 10 kHz. The essentially identical small signal transfer functions of the first and second preamplifiers support phase matching of the first and second digital audio signals. As will be explained below, there are certain advantages associated with providing simultaneous zero-crossings of the first and second digital audio signals in connection with switching forth and back between these.

In alternative embodiments, the difference between the first and second signal amplifications may be created by a combination of signal attenuation provided by the attenuator and a gain difference between the first and second preamplifiers. The second preamplifier may function as a unity gain buffer or as an amplifier with a considerable gain for example more than 10 dB or more than 20 dB, throughout at least a portion of the audio frequency range such as between 300 Hz and 3 kHz. In both cases, the second preamplifier preferably has high input impedance, preferably larger than 100 MΩ, such as larger than 1 GΩ or even larger than 10 GΩ measured at 1 kHz to ensure minimal loading of the audio input signal or minimal loading of the leg of the attenuator.

In yet another embodiment where the small signal transfer functions of the first and second preamplifiers differ, the small signal transfer function of the second preamplifier comprises a pole at a lower frequency, such as below 20 Hz or 10 Hz, than a lowest or smallest pole of the small signal transfer function of the first preamplifier. The pole of the second preamplifier may advantageously be set to a much lower frequency than the lowest pole of the first preamplifier such as 10 times lower. This difference in pole frequencies makes it relatively easy to design a digital filter, which may reside externally to the present audio amplification circuit, with a transfer function that comprises zero located proximate in frequency to the pole of the second preamplifier to cancel effects of this pole on the small signal transfer function of the second preamplifier. The digital filter may additionally comprise a pole matched in frequency to the lowest pole of the small signal transfer function of the first preamplifier and thus ensure excellent phase matching between the first and second signal channels.

In a number of useful embodiments of the invention, the first preamplifier and/or the second preamplifier comprises a differential amplifier having a non-inverting input operatively coupled to the input terminal of the audio amplification circuit for receipt of the audio input signal. A feedback network is coupled between an output and an inverting input of the first preamplifier or between an output and an inverting input of the second preamplifier. This preamplifier configuration provides large input impedance at the non-inverting input coupled the audio input signal by isolating the feedback network there from. In an even further advantageous embodiment, the feedback network establishes a lowpass transfer function from the output of the differential amplifier to the inverting input of the first or the second preamplifier. This may be accomplished by selecting a suitable configuration of capacitors and resistive components in the feedback network. To facilitate integration on a semiconductor substrate, resistive components of the feedback network may comprise MOS transistors operating or biased in their respective triode regions. In other embodiments of the invention, the first preamplifier and/or the second preamplifier comprise respective single-ended inputs operatively coupled to the input terminal of the audio amplification circuit and respective differential outputs operatively coupled to respective differential inputs of the first and second analogue-to-digital converters.

The first and second analogue-to-digital converters preferably comprise respective sigma-delta converters generating the first and second digital audio signals, respectively, at respective oversampled sampling frequencies or rates such as sampling rates between 1 MHz and 10 MHz. Alternatively, non-oversampling analogue-to-digital converters, for example operating with sampling frequencies in the range between 16 and 48 kHz, may applied to digitize respective analogue signals supplied by the first and second preamplifiers and deliver corresponding first and second digital audio signals. Such non-oversampling analogue-to-digital converters may comprise successive approximation or flash converters.

If the first and second analogue-to-digital converters comprises respective oversampled sigma-delta converters, the present audio amplification circuit may comprise a first decimation filter configured for receipt and down-sampling of the first digital audio signal from a first oversampled sampling rate or frequency to a final or Nyquist sampling frequency. A second decimation filter is likewise configured for receipt and down-sampling of the second digital audio signal from a second oversampled sampling rate to a final or Nyquist sampling frequency. The first and second oversampled sampling frequencies are preferably identical and the first and second Nyquist sampling frequencies too. The sampling frequency of each of the first and second digital audio signals after down-sampling to Nyquist sampling frequency is preferably set to value between 8 kHz and 96 kHz such as between 16 kHz and 48 kHz. The down-sampling of the first and second digital audio signals is preferably accompanied by lowpass filtering to eliminate or attenuate high-frequency noise and distortion products above the final or Nyquist sampling frequency in the corresponding oversampled digital audio signals.

The amplitudes of the first or second digital audio signals are preferably scaled to have essentially identical levels before transmission to the one or more externally accessible output terminals or pads of the present audio amplification circuit. According to this embodiment, the present audio amplification circuit comprises a digital signal scaling function adapted to scaling the first or second digital audio signal with a preset or adaptive gain factor to compensate for an amplification difference between the first and second signal amplifications.

The integrated semiconductor circuit may advantageously comprise an overload protection or signal limiting feature coupled to the input pad or terminal. This feature protects both active and passive components, such as input transistors and attenuator components like resistors and capacitors, on the integrated semiconductor circuit against overvoltage conditions. Overvoltage conditions may lead to destruction or malfunctioning of the active or passive components due to excessive substrate currents. According to a preferred embodiment, the integrated semiconductor circuit comprises two or more cascaded non-linear elements, such as diodes or diode-coupled transistors, operatively coupled between the input terminal and at least one of {a DC power supply rail, a DC reference voltage} to clamp the audio input signal at a first limiting level. The DC power supply rail may comprise a positive or negative DC power supply voltage or ground (GND). The DC reference voltage may comprise a regulated DC voltage or bandgap derived DC voltage any other reasonably well-defined and stable DC voltage of the integrated semiconductor circuit. The first limiting level may be set to a numerical value of between about 1.0 Volt and 2.5 Volt for example by using between two and five cascaded diodes or diode-coupled transistors as the non-linear elements. One embodiment utilizes comprises two sets or strings of non-linear elements mounted in anti-parallel configuration where each set comprises two or more cascaded non-linear elements. In this embodiment, the two sets of anti-parallel non-linear elements set both the first limiting level and a second limiting level. By appropriate selection of number and type of the cascaded non-linear elements the audio input signal can be clamped at two differing limiting levels for example a first limiting level between 1.0 Volt and 2.5 Volt above a quiescent or DC bias voltage at the input terminal and second limiting level between 1.0 Volt and 2.5 Volt below said quiescent or DC bias voltage at the input terminal.

The input of the first preamplifier, or even the second preamplifier, may additionally be provided with a separate overload protection or signal clamping to prevent the preamplifier in question from being driven too far into an overload state. This type of overloading may result in long recovery or settling time of the first and/or second preamplifier(s) after the level of the audio input signal has returned to a level below the level causing the overload state. According to one such embodiment, a single or several cascaded non-linear semiconductor elements, such as a diode or a diode-coupled transistor, are coupled to an input of the first preamplifier to clamp the input signal at a first preamplifier limiting level. The first limiting level is numerically larger than the first preamplifier limiting level such as between 0.5 and 2.0 volt larger. This difference in absolute or numerical limiting levels may be accomplished by using different numbers of cascaded non-linear elements in the respective networks at the input terminal and at the first preamplifier input.

In case the integrated semiconductor circuit comprises the previously-mentioned externally accessible output terminal(s) for signal transmission it may additionally comprise a digital audio interface operatively coupled in-between the first and second digital audio signals and the externally accessible output terminal or terminals. The digital audio interface is configured to convert the first and second digital audio signals at the final or Nyquist sampling rate into a digital audio stream compliant with a standardized data communication/digital audio protocol such as I²S, S/PDIF, AES/EBU, SLIMbus™. In the alternative, the first and second digital audio signals in their respective oversampled formats may be routed to separate externally accessible output terminals in a proprietary format.

The first and second digital audio signals are preferably transmitted on a single common data line as time-multiplexed data or streams of digital audio samples. Alternatively, two separate data lines may be utilized for transmitting respective ones of the first and second digital audio signals.

In one embodiment of the invention, the audio amplification circuit comprises a clock input terminal for receipt of an external clock signal and the respective sampling frequencies of the first and second analogue-to-digital converters are set by an internal clock signal of the audio amplification circuit derived from the external clock signal. This embodiment is particularly useful where an associated audio signal controller resides within a portable terminal in form of an appropriately programmed or configured Digital Signal Processor (DSP) with data interface terminal(s) operatively coupled to the externally accessible output terminal for receipt of the first and second digital audio signals. The external clock signal is supplied from the DSP of the portable terminal to the clock input terminal of the audio amplification circuit and transmission of the first and second digital audio signals via the one or more externally accessible output terminals is synchronized to the external clock signal allowing the DSP of the portable terminal to act as a master for the transmission process.

The audio amplification circuit may comprise a digital signal scaling function adapted to scaling the first or second digital audio signal with a preset or adaptive gain factor to compensate for an amplification difference between the first and second signal amplifications. The scaling function is operative to equalize levels of the first and second digital audio signals before transmission to the associated audio signal controller. The scaling function may of course be implemented on the associated audio signal controller instead. Preferably, only one of the first and second digital audio signals is scaled to minimize computational burden associated therewith, but alternatively both of the first and second digital audio signals may be scaled by respective preset or adapted gain factors.

The first or second first preamplifier may have anyone of a plurality of circuit topologies known in the art. The first and second preamplifier may have essentially identical circuit topologies to facilitate matching of their small signal transfer functions through the audio frequency range or at least a part thereof. In one embodiment, the first preamplifier or the second preamplifier comprises a differential amplifier having a non-inverting input operatively coupled to the input terminal of the audio amplification circuit for receipt of the audio input signal and a feedback network coupled between an output and an inverting input of the differential amplifier. In one other embodiment, the first or second preamplifier has a single-ended input and a differential output and in yet another embodiment, the first or second preamplifier has differential input and differential output.

In other embodiments, the feedback network is configured to provide a lowpass transfer function from the output of the differential amplifier to the inverting input of the differential amplifier. Consequently, a high-pass small signal transfer function which is useful for attenuating low-frequency noise in the audio input signal and for suppression of effects of DC offsets at the input of the first or second preamplifier is provided.

In accordance with a favourable embodiment or aspect of the invention, a semiconductor die or substrate comprises an audio amplification circuit according to any of the above-disclosed embodiments of the audio amplification circuit. The integrated semiconductor die is preferably fabricated in a sub-micron CMOS semiconductor process.

Another aspect of the invention relates to a miniature capacitive microphone which comprises a capacitive transducer element responsive to impinging sound to generate a corresponding transducer signal on a transducer signal terminal. According to this aspect the input pad or terminal of an integrated semiconductor circuit in accordance with any of the above described embodiments of this circuit is operatively coupled to the transducer signal terminal for receipt of the transducer signal. The miniature capacitive microphone may be formed by an ECM or a microelectromechanical (MEMS) condenser microphone shaped and sized for mobile terminal applications.

Yet another aspect of the invention relates to a method of amplifying audio signals, the method comprising:
 receiving an analogue audio input signal at an input terminal of an amplification circuit,
 applying the analogue audio input signal to an input of a first preamplifier,
 generating a first amplified output signal by the first preamplifier having a first signal amplification,
 converting the first amplified output signal to first digital audio signal,
 applying the analogue audio input signal to an input of a second preamplifier,
 generating a second amplified audio signal by second preamplifier having a second signal amplification. The second signal amplification is smaller than the first signal amplification preferably with a value or amount of at least 10 dB throughout a frequency range between 300 Hz and 3 kHz.

The method of amplifying audio signals may further comprise steps of:
 attenuating the analogue audio input signal with a predetermined amount or factor,
 applying the attenuated analogue audio input signal to an input of the second preamplifier.

The present method of amplifying audio signals may comprise an additional step of:
 clamping the analogue audio input signal at a first limiting level by a cascade of two or more non-linear elements, such as diodes or diode-coupled transistors, operatively coupled between the input terminal and at least one of {a DC power supply rail, a DC reference voltage}.

The present amplification circuit and method of amplifying audio signals are well-suited for cooperating with, and optionally physically integration with, an audio signal controller so as to form a complete audio amplification system. The audio signal controller is configured for receipt and processing of the first and second digital audio signals according to a switching scheme or algorithm as discussed in detail below.

The audio signal controller is preferably adapted to execute steps of:
 receiving first and second digital audio signals,
 estimating a signal feature of the first digital audio signal or the second digital audio signal,
 comparing the estimated signal feature with a predetermined feature criterion,
 switching from conveying the first digital audio signal to conveying the second digital audio signal to the controller output, or vice versa, at a zero-crossing of the first digital audio signal or the second digital audio signal based on the comparison between the estimated signal feature and the predetermined feature criterion.

The present audio signal controller is well-suited to cooperate with and receive the first and second digital audio input signals generated by respective signal channels of an audio amplification circuit with a dual-channel (or more signal channels) architecture to form a complete interconnected audio amplification system as described below with reference to the accompanying FIG. 1. In such an audio amplification system, the present audio signal controller may function as a back-end processor while the above-mentioned audio amplification circuit may operate as a front-end processor adapted to derive the first and second digital audio signals from a common analogue audio input signal. In some types of applications, the audio amplification circuit may advantageously generate the first and second digital audio signals with first and second signal amplifications, respectively, through respective ones of first and second signal channels or paths. The second signal amplification may be significantly smaller than the first signal amplification such as at least 10 dB, preferably more than 20 dB or 40 dB, smaller than the first signal amplification throughout a frequency range between 300 Hz and 3 kHz.

However, the skilled person will understand that the present audio signal controller is fully capable of operation in conjunction with other types of front-end amplification/conversion circuits than the above-described dual-channel audio amplification circuit. As previously mentioned, the present audio signal controller can be coupled to a mating or interoperable output of a front-end amplification/conversion circuit which supplies first and second digital audio signals representative of the common analogue audio input signal. In one useful application, the front-end amplification/conversion circuit may comprise a dual-channel audio amplification and digitization circuitry to provide the first and second digital audio signals with different overload limits for example caused by a difference in signal amplifications.

The audio signal controller is adapted to switching from conveying or transmitting the first digital audio signal to conveying or transmitting the second digital audio signal to the controller output, or vice versa, at a zero-crossing of the first digital audio signal or the second digital audio signal. In a preferred embodiment, the switching between the first and second digital audio signals is exclusively effected at a substantially simultaneous zero-crossing of the first and second digital audio signals. By effecting the signal switching at a zero-crossing of the first and/or the second digital audio signal generation of audible artifacts such as "clicks", "pops" or other objectionable artifacts in connection therewith is eliminated or at least considerably suppressed. Switching at the zero-crossings of the first and/or the second digital audio signal(s) minimizes error energy in a waveform of an outgoing digital audio signal the controller output by suppressing waveform discontinuities at a signal switch point.

The outcome of the comparison between the estimated signal feature and the predetermined feature criterion determines at which zero-crossings a switch from transmitting the first digital audio signal to transmitting the second digital audio signal, or vice versa, to the controller output is to be made. The audio signal controller may be adapted to detect various types of predetermined signal features of the first or second digital audio signal such as a level of the first digital audio or the second digital audio signal, non-linear distortion of the first or the second digital audio signal, a DC level of the first or the second digital audio signal, a noise level of the first or the second digital audio signal or, a spectral feature of the first or the second digital audio signal or any combinations of these signal features. In one embodiment of the invention, the predetermined signal feature is the level of the first digital audio signal or the second digital audio signal or a combination of levels of the first and second digital audio signals.

One useful signal feature is the level of the first or second digital audio signal, or a combination of both, which is computable or detectable with good precision and reliability in a relatively straight-forward manner. The level may be estimated in various ways in either time domain or frequency domain or a combination of both. The level of the first or second digital audio signal may be estimated as running average amplitude or power of the digital audio signal(s) in question. The running average amplitude or power may comprise a simple half-wave or full-wave rectified average amplitude, a RMS average amplitude or power, a short-term average amplitude or power, a short-term RMS amplitude or power.

The running average amplitude or power may be determined over a time window with a length between 0.1 millisecond and 200 milliseconds wherein a corresponding number of samples of the digital audio signal(s) in question are summed. Naturally, samples within the chosen time window may be multiplied by a suitable weight function such as a triangular function or exponential function.

A detected level can, by comparison with one or more predetermined threshold levels (i.e. predetermined feature criterion), be used to indicate how far the first or the second digital audio signal is from its overload limit.

When the first and second digital audio signals are derived from the common audio input signal with first and second signal amplifications, respectively, in the manner described above, the level estimate may in some embodiments of the invention be derived from the first digital audio signal. This is of significant interest where the first preamplifier and the first analogue-to-digital converter both posses predictable overload characteristics. In this embodiment the predetermined threshold level may be set to value somewhat below the lower one of an overload limit of the first preamplifier and an overload limit of the first analogue-to-digital converter such as between 1 and 6 dB below the overload limit in question.

However, in a large number of useful embodiments of the audio signal controller the estimated level is derived from the second digital audio signal. Using the second digital audio signal for level estimation ensures that the actual level of the audio input signal is indicated across an entire target dynamic range of the audio input signal. The second channel is often designed to respond substantially linearly to the audio input signal over the entire target or intended dynamic range of the associated audio amplification circuit. This means that the level estimate computed by the audio signal controller remains uncorrupted by potentially unpredictable non-linear overload and settling characteristics of the second preamplifier and/or second analogue-to-digital converter. In microphone signal applications of the present audio signal controller, the predetermined feature criterion, for example comprising a certain threshold level, will often be set to value which corresponds to a target or desired sound pressure level on a microphone transducer element at a reference frequency. The target sound pressure level may be set to a value between 100 dB SPL and 130 dB SPL for a number of useful mobile terminal applications of the present audio signal controller. In this way, the first digital audio signal will represent small and normal (human speech produces around 65-70 dB SPL average measured at 1 meter distance) sound pressure levels for example within a range from 0 to 100 dB SPL while very large sound pressure levels above 100 dB SPL will be represented by the second digital audio signal which is transmitted to the controller output instead of the first digital audio signal once the estimated level exceeds the predetermined threshold level. When the estimated level subsequently drops to a level below the predetermined threshold level, e.g. 100 dB SPL, the audio signal controller switches from conveying the second to conveying the first digital audio signal to the controller output. This switching between, or swapping of, the first and second digital audio signals may advantageously be effected with a certain preset or adaptive time constant as described below.

In an advantageous embodiment, the audio signal controller is adapted to execute steps of:
estimating the level of the first digital audio signal or the second digital audio signal with a first time constant for increasing absolute values of audio signal samples of the first or second digital audio signal,
estimating the level of the first digital audio signal or the second digital audio signal with a second first time constant for decreasing absolute values of audio signal samples of the first or second digital audio signal;
the second time constant being larger than the first time constant.

The different time constants can be used to set different attack and release times for switching between conveying the first or second digital audio signal to the controller output. A relatively short attack time such as between 20 µS and 200 µS may be set for the increasing absolute values of audio signal samples of the first digital audio signal or the second digital audio signal. The first time constant may in one extreme be set to a value that corresponds to a single sample time interval of the first or the second digital audio signal so as to provide a peak-tracking level estimate. A relatively short attack time ensures that the audio signal controller reacts rapidly once the estimated level exceeds the predetermined threshold level and switches output state as soon as a zero-crossing is detected so as to convey the second digital audio signal instead of the first digital audio signal to the controller output. The rapid reaction to signal levels exceeding the predetermined threshold level ensures that clipping or overload distortion of the first digital audio signal is effectively suppressed in the outgoing digital audio signal provided at the controller output. A relatively long release time, such as between 1 mS and 200 mS, or between 1 mS and 40 mS, tend to suppress rapid switching back and forth between conveying the first or second digital audio signal to the controller output under signal conditions where the level of the digital audio signal that is detected (i.e. the first or second digital audio signal) is fluctuating rapidly just above and below the predetermined threshold level. Furthermore, when the first and second digital audio signals are derived from, or representative of, the common audio input signal with first and second signal amplifications, respectively, in the manner described above, the relatively large value of the second time constant or the release time may provide significant benefits in numerous situations because the long release time allows signal processing and conditioning circuitry of the first signal channel, in particular the first preamplifier, to recover theirs/its nominal operating points before the first digital audio signal is transmitted to the controller output. The signal amplification and processing circuitry of the first signal channel of the associated audio amplification circuit may have been forced into a highly non-linear operating state during a preceding time period with a very high level of the audio input signal. It may accordingly take significant time before this circuitry is settled to its nominal operating point and capable of low-distortion signal amplification and processing.

A practical manner of providing first and second level estimates of the first digital audio signal or the second digital audio signal comprises adapting the audio signal controller to execute steps of:

a)—initializing a peak tracking variable, MaxPeak, representing a maximum absolute value of the first or the second digital audio signal between a pair of consecutive zero-crossings of the first or the second digital audio signal, to an initial value, b)—comparing an absolute value of a current audio signal sample, ABS x(n), of the first digital audio signal or the second digital audio signal with a current level estimate, Yp(n−1), c)—computing an updated level estimate, Yp(n), with the first time constant if the absolute value of the current audio signal sample is larger than the current level estimate, Yp(n−1), d)—computing the updated level estimate, Yp(n), with the second time constant if the absolute value of the current audio signal sample is smaller than the current level estimate, Yp(n−1), d)—comparing the value of peak tracking variable, Maxpeak, with the updated level estimate, Yp(n), e)—if the updated level estimate, Yp(n), is larger than the peak tracking variable, MaxPeak, updating the value of MaxPeak to Yp(n), f)—if the updated level estimate, Yp(n), is smaller than the peak tracking variable, MaxPeak, retaining a current value of MaxPeak, g)—detecting a zero-crossing of the first digital audio signal or the second digital audio signal, h)—when a zero-crossing is detected, compare the value of MaxPeak to a first predetermined threshold level, i)—if the value of MaxPeak is larger than the first predetermined threshold level: switch to transmitting the second digital audio signal to the controller output or continue to transmitting the second digital audio signal to the controller output, j)—if the value of MaxPeak is smaller than the first predetermined threshold level: switch to transmitting the first digital audio signal to the controller output or continue to transmitting the first digital audio signal to the controller output.

In this preferred embodiment, the first or the second digital audio signal is monitored for the presence of a zero-crossing. A zero-crossing may conveniently be indicated by setting a flag or similar indicator in a dedicated memory location or register of the audio signal controller. If no zero-crossing has been detected, the audio signal controller preferably retains its current output state by continuing to transmit a current digital audio signal to the controller output and continue to monitor the first or the second digital audio signal for a zero-crossing. On the other hand, once a zero-crossing has been detected the audio signal controller proceeds by executing steps i) and j) as stated depending upon an outcome of the comparison between the value of MaxPeak and the first predetermined threshold level. A change or switch of output state of the audio signal controller during execution of step i) may be effected if the current output state transmits the first digital audio signal to the controller output. Likewise, a change of output state of the audio signal controller during execution of step j) may be effected if the current output state transmits the second digital audio signal to the controller output.

In a further refined embodiment, two different predetermined threshold levels are utilized to provide additional hysteresis in the switching between output states of the audio signal controller. The two different predetermined threshold levels may be spaced with an amount of 3 to 10 dB in level. The audio signal controller is adapted to execute further steps after step i) of:

i1)—comparing the value of MaxPeak to a second predetermined threshold level smaller than the first predetermined threshold level with a predetermined amount, i2)—if the value of MaxPeak lies between the second predetermined threshold level and the first predetermined threshold level: continue transmitting a current one of first or the second digital audio signal to the controller output, i3)—if the value of MaxPeak is smaller than the second predetermined threshold level: transmitting the first digital audio signal to the controller output In another embodiment, the signal feature comprises a DC level of the first digital audio signal. The DC level may be useful for example to indicate whether or not the first signal channel of the above-described audio amplification circuit operates in a substantially linear state well below its overload limit. If the estimated DC level of the first digital audio signal indicates the first signal channel operates in a substantially linear region or state, the audio signal controller may be adapted to switch output state so as to convey the first digital audio signal instead of the second digital audio signal to the controller output. In case the audio signal controller already transmits the first digital audio signal to the controller output it retains this output state. Yet another useful signal feature may be a shape of frequency spectrum of the first digital audio signal where significant overload of the first signal channel may be detected by the audio signal controller by identifying a skewed frequency spectrum of the first digital audio signal caused by preamplifier clipping and/or A/D converter overload.

In another advantageous embodiment, the suppression of audible artifacts in connection with the switching of output states of the audio signal controller may be further enhanced by detecting essentially simultaneous zero-crossings of the first and second digital audio signals and solely switch output state when a simultaneous zero-crossings is detected instead of relying on a zero-crossing of just one of the first and second digital audio signals to effect a switch of output state. The signal controller is therefore adapted to execute steps of:

monitoring the first and second digital audio signals and detect respective zero-crossing of the first and the second digital audio signals, detecting a substantially simultaneous zero-crossing of the first and second digital audio signals, switching from conveying the first digital audio signal to conveying the second digital audio signal to the controller output, or vice versa, at the substantially simultaneous zero-crossing of the first and second digital audio signals.

In the present context, the term "a substantially simultaneous zero-crossing" designates a zero-crossing of the first digital audio signal and a zero-crossing of the second digital audio signal taking place within a window of 10 or less sample time intervals such as less than 3 sample time intervals. The duration of a sample time interval is determined by respective Nyquist sampling frequencies of the first and second digital audio signals which preferably lie between 8 kHz and 48 kHz such as between 16 kHz and 48 kHz. This embodiment has the advantage that the switching of the output state of the audio signal controller is dynamically controlled and may take non-linear behaviour of transfer functions of one or both of the first and second signal channels of the associated audio amplification circuit into account. The present inventors have experimentally verified that an input impedance at the input terminal of the associated audio amplification circuit may behave non-linearly at very high or large levels of the audio input signal and modulate the transfer functions of one or both of the first and second signal channels. This modulation of the transfer function or functions tend to impair an otherwise (for small signal operation) well-matched phase relationship between the first and second digital audio signals. In accordance with the present embodiment, the audio signal controller is adapted to solely to change output state in response to substantially simultaneous zero-crossings of the first and second digital audio signals. In this manner, a zero-crossing in only one of the first and second digital audio signals is ignored and the audio signal controller retains its current output state by continuing to convey the first or second digital audio signal, as the case may be, to the controller output.

In embodiments of the audio signal controller where the first and second digital audio signals are derived from the common audio input signal with first and second signal amplifications, respectively, in the manner described above in connection with the functionality of the audio amplification circuit, the present audio signal controller accomplishes transmitting an essentially noise free digital audio signal to the controller output at low and normal levels of the audio input signal in form of the first digital audio signal. Additionally, the present audio signal controller may also provide an undistorted digital audio signal to the controller output at high and extremely high levels of the audio input signal by transmitting the second digital audio signal to the controller output by an appropriate setting of the predetermined feature criterion.

When the first and second digital audio signals are derived from the common audio input signal with first and second signal amplifications, respectively, in the manner described above, the controller output accordingly toggles between two different output states in form of a low sensitivity or amplification state where the second digital audio signal is transmitted to the controller output and a normal sensitivity state where the first digital audio signal is transmitted instead. Even though the input referred noise floor may be elevated during time intervals wherein the second digital audio signal is transmitted at the controller output due to the lower signal amplification of the second channel, this effect can be effectively masked to the human auditory system by a simultaneous high level of the audio input signal. The auditory masking of the elevated input referred noise floor can be improved if appropriate time constants in form of attach and release times are chosen for switching output states at the controller output as described below.

Preferably, switching from conveying the first digital audio signal to the second digital audio signal, or vice versa, to the controller output is effected without any summing, blending or mixing of the first and second digital audio signals prior to selecting one of these by the audio signal controller. The selective transmission of either the first digital audio signal or the second digital audio signal minimizes computational and hardware resource expenditure of the audio signal controller since signal selection can be effected by providing appropriate control signals to a simple 2-1 multiplexer (3-1, 4-1 etc multiplexers if three, four or more separate signal channels are provided). Likewise, a corresponding multiplex operation on a programmable microprocessor can also be implemented very efficiently in terms of program instructions or power consumption. In this manner, the outgoing digital audio signal transmitted at the controller output essentially forms a concatenated stream of digital audio samples comprising intermittently arranged and abutted segments of the first and second digital audio signals arranged or selected in accordance with outcomes of the comparisons between the estimated signal feature and the predetermined feature criterion.

The audio signal controller may be adapted to detecting zero-crossings of the first and/or the second digital audio signals in a variety of different ways. According to a preferred embodiment, the signal controller is adapted to detecting sign changes of the first and/or the second digital audio signals. A sign change may be detected by monitoring values of a sign bit, or other features, of samples of the first and/or the second digital audio signals in accordance with characteristics of the particular binary number system in which these digital audio signals are represented. The binary number system may be one of signed magnitude, redundant binary signed digit, two's complement etc.

Preferably, the audio signal controller is adapted to switch output state in less than 1 ms, more preferably less than 625 μS, or even more preferably less than 208 μS such as less than 62.5 μS, within a zero-crossing of the first or the second digital audio signal. These time intervals may correspond to a single or a few sample time intervals, such as within 10 sample time intervals, of each of the first and the second digital audio signals when these are provided at their respective final or Nyquist sampling frequencies. The respective Nyquist sampling frequencies of the first and the second digital audio signals may conveniently lie between 16 kHz and 48 kHz so that a sample time interval between samples of the first digital audio signal or samples of the second digital audio signal lies between 20.8 and 62.5 μS to comply with standardized or at least often used sampling frequencies of digital audio systems. A rapid switching after or before a detected zero-crossing ensures that the first and/or second digital audio signals still has/have an instantaneous amplitude reasonably close to zero to ensure minimum "click" sounds. Actual signal deviation from zero will depend on a slew rate of the first or second digital audio signals at the zero-crossing.

As explained above, the switch, or swapping, of output state of the audio signal controller is preferably performed at the first zero-crossing of the first or second digital audio signal after the estimated level exceeds the predetermined threshold level.

However, in certain embodiments the switch of output state may alternatively be effected at a zero-crossing shortly preceding the point in time where the estimated level exceeded the predetermined threshold level. This is possible if the respective segments of first and second digital audio signals are intermediately stored in a delay buffer. Each segment may comprise a predetermined number of samples of the first or second digital audio signals for example a number of samples corresponding to a duration between 1 and 100 milliseconds of the digital audio signal in question. In this embodiment of the invention, the audio signal controller may be adapted to search through the predetermined number of samples held in the delay buffer in response to detecting that the estimated level exceeds the predetermined threshold level, to find a zero-crossing of one or both of the first and second digital audio signals. In an alternative embodiment, zero-crossing of the first and/or second digital audio signal are continuously flagged or marked by the audio signal controller while respective segments of the first and second digital audio signals are temporarily stored in the delay buffer prior to being selected by the audio signal controller. When the estimated level exceeds the predetermined threshold level and the audio signal controller determines that the output state is to be switched, the audio signal controller is adapted to compute the memory location or address of the delay buffer at which the preceding zero-crossing of the first and/or second digital audio signal(s) took place based on a setting of the flag. Once, the appropriate zero-crossing storage address in the delay buffer has been computed, the audio signal controller effects the swapping of the first and second digital audio signals in the delay buffer at the determined zero-crossing storage address.

The use of such a delay buffer for intermediate storage of the first and second digital audio signals may be unacceptable for certain real-time constrained speech applications such as mobile phone applications because of its addition of propagation delay to the audio signal controller. However, in other less real-time constrained audio applications such as sound recorders of video cameras, the use of a delay buffer can be fully acceptable.

A preferred embodiment of the present audio signal controller is adapted to, before the step of estimating the signal feature of the first digital audio signal or the second digital audio signal, execute steps of:
  filtering the first digital audio signal by first digital DC blocking filter,
  filtering the second digital audio signal by a second DC blocking filter.

The first and second digital DC blocking filters may comprise respective digital high-pass filters having substantially identical highpass cut-off frequencies where the high-pass cut-off frequencies are lower than 30 Hz, preferably lower than 15 Hz to allow the signal feature estimation to accurately detect or reflect peak amplitudes of large low-frequency or infrasonic signals imparted on analogue signal processing and amplification circuit of an associated audio signal amplification circuit. Digital high-pass filters with substantially identical highpass cut-off frequencies can readily be made highly accurate with well-matched transfer functions. This feature is helpful in maintaining good phase matching between the first and second digital audio signals.

The first and second digital DC blocking filters are additionally operative to eliminate DC voltage differences between the first and second digital audio signals. Such DC voltage differences may have been introduced by mismatched DC bias settings of analogue signal processing and amplification circuits involved in generation of the first and second digital audio signals. The analogue signal processing and amplification circuits may for example comprise the first and second preamplifiers and/or first and second analogue-to-digital converters of the previously described audio amplification circuit in situations where the latter circuit is responsible for generating the first and second digital audio signals. In practice the DC level matching between these analogue signal processing and amplification circuits will never be completely accurate even though careful design or integrated circuit layout techniques can be applied to improve matching.

In one embodiment of the audio signal controller, the second digital audio signal is a subjected to digital filtering in a digital compensation filter having a transfer function that comprises zero located proximate in frequency to a pole of the second preamplifier of the associated audio amplification circuit to cancel frequency response effects of this pole on the small signal transfer function of the second preamplifier. The digital compensation filter may additionally comprise a pole matched in frequency to a lowest pole of a small signal transfer function of the first preamplifier of the associated audio amplification circuit. Since the pole of the digital compensation can be placed with very high accuracy excellent phase matching between the first and second digital audio signals is possible.

Flexibility and interoperability of the present audio signal controller may be enhanced by adapting the audio signal controller to supporting receipt and processing of the first and second digital audio signals in a variety of formats including bit-stream formats. A preferred embodiment of the audio signal controller is adapted to execute steps of:
  receiving the first digital audio signal at an oversampled frequency and down-sampling to the final or Nyquist sampling frequency in a first decimation filter,
  receiving the second digital audio signal at an oversampled frequency and down-sampling to the final or Nyquist sampling frequency in a second decimation filter.

The audio signal controller may accordingly receive the first and second digital audio signals as respective oversampled bit-streams generated by an sigma-delta type analogue-to-digital converter and decimate and convert each of these into a standardized N-bit format (N typically being a positive integer between 8 and 24) such as two's complement etc.

The audio signal controller is preferably adapted to estimate the signal feature of the first or second digital audio signal at the Nyquist sampling frequency if the first or second digital audio signal is received in oversampled format. The down-sampling process typically includes lowpass filtering the digital audio signal in question to suppress high-frequency noise above the audio bandwidth generated by the sigma-delta type analogue to digital conversion. The reliability of the signal feature estimation is likely to be improved once the high-frequency noise has been suppressed or eliminated.

Likewise, the audio signal controller may advantageously be adapted to execute step of detecting the zero-crossing of the first or the second digital audio signal at a Nyquist sampling frequency of the first or the second digital audio signal improve the reliability in the zero-cross detection by relying on a low-noise digital audio signal.

Finally, the switching of output state of the audio signal controller is advantageously applied to the first or second digital audio signals at the Nyquist sampling frequency.

The amplitudes of the first or second digital audio signals are preferably scaled so as to posses essentially identical levels before they are selectively transmitted to the controller output of the audio signal controller. The audio signal controller is preferably adapted to ensure this by executing a step of scaling the first or second digital audio signal with a preset or adaptive gain factor to compensate for an amplification difference between the first and second signal amplifications of the associated audio amplification circuit. This step or signal manipulation ensures the level of the concatenated outgoing digital audio signal transmitted at the controller output is substantially independent of the output state, i.e. independent of whether the first or the second digital audio signal is transmitted at the controller output. The scaling is preferably performed by multiplying the first digital audio signal with a gain factor that corresponds to a determined amplification difference between the first and second signal amplification. The gain factor may have a preset value according to a priori knowledge of an amplification difference between the first and second signal channels of the associated audio amplification circuit or the gain factor may be determined during a factory calibration of a complete audio amplification system which comprises the present audio signal controller interconnected to the associated audio amplification circuit. According to yet another embodiment, the gain factor is adaptively determined during operation of the audio amplification system by the audio signal controller. The signal controller may be adapted to detect and compare the respective levels of the first and second digital audio signals during periods of time where the level of the first digital audio signal is below the predetermined threshold level or another suitable threshold level where the first and second signal channels are known to operate in substantially linear mode.

The audio signal controller may comprise a programmable microprocessor such as a programmable fixed-point or programmable floating-point Digital Signal Processor. The skilled person will, however, understand that the above-described steps and functionality of the present audio signal controller may be implemented by program instructions/routines executed by the programmable microprocessor or, alternatively, implemented as fixed or hard-wired application specific circuit blocks with appropriately configured digital arithmetic and logic units or any combination of microprocessor program instructions and hard-wired application specific circuit blocks.

In accordance with another aspect of the audio signal controller, there is provided a computer readable data carrier comprising compilable or executable microprocessor program instructions adapted to, when loaded into a program memory of the above-described programmable microprocessor, cause the microprocessor to execute the respective step, or set of steps, of any of the above-described embodiments of the audio signal controller.

In accordance with a favourable embodiment or aspect an audio signal controller according to any of the above-disclosed embodiments is integrated on a semiconductor die or chip. The integrated semiconductor die is preferably fabricated in a sub-micron CMOS semiconductor process to allow large scale manufacturing of the audio signal controller at very low costs.

Yet another aspect of the audio signal controller relates to a method of selectively conveying a first or a second digital audio signal to a controller output of an audio signal controller, the method comprising steps of:

a)—receiving the first and second digital audio signals in first and second data memory locations, respectively,
b)—estimating a signal feature of the first digital audio signal or the second digital audio signal,
c)—comparing the estimated signal feature with a predetermined feature criterion,
d)—switching from conveying the first digital audio signal to conveying the second digital audio signal to an audio signal controller output, or vice versa, at a zero-crossing of the first digital audio signal or the second digital audio signal based on the comparison between the estimated signal feature and the predetermined feature criterion.

The method may advantageously comprise further steps of:
e)—monitoring the first and second digital audio signals and detect respective zero-crossing of the first and the second digital audio signals,
f)—detecting a substantially simultaneous zero-crossing of the first and second digital audio signals,
g)—switching from conveying the first digital audio signal to conveying the second digital audio signal to the controller output, or vice versa, at the substantially simultaneous zero-crossing of the first and second digital audio signals.

Another aspect of the invention relates to a computer readable data carrier comprising compilable or executable microprocessor program code or instructions adapted to, when loaded into a microprocessor program memory, cause the microprocessor to execute steps a)-d) of above-referenced method of selectively conveying a first or a second digital audio signal to a controller output of an audio signal controller. The computer readable data carrier may comprise additional compilable or executable microprocessor program code adapted to cause the microprocessor to execute steps e)-g) above.

The computer readable data carrier may comprise data carriers such as optical or magnetic discs, memory assemblies or sticks comprising semiconductor memory devices such as flash memory, ROM, PROM, EPROM or EEPROM.

A final aspect relates to a Digital Signal Processor assembly comprising a program memory storing executable program instructions or code adapted to cause the Digital Signal Processor to execute:
steps a)-d) of above-referenced method of selectively conveying a first or a second digital audio signal to a controller output of an audio signal controller and, preferably additionally,
steps e)-g) described above. The Digital Signal Processor assembly preferably comprises a general purpose commercially available Digital Signal Processor such as a floating-point SHARC® Processor fabricated by Analog Devices.

BRIEF DESCRIPTION OF THE DRAWINGS

Preferred embodiments of the invention will be described in more detail in connection with the append drawings in which.

DESCRIPTION OF PREFERRED EMBODIMENTS

Preferred embodiments of the invention will be described and discussed in the following passages. The present embodiment of the invention will be described in connection with an associated audio signal controller that may be operatively coupled to the present audio amplification circuit to illustrate benefits and advantages of the invention.

Figure 1:
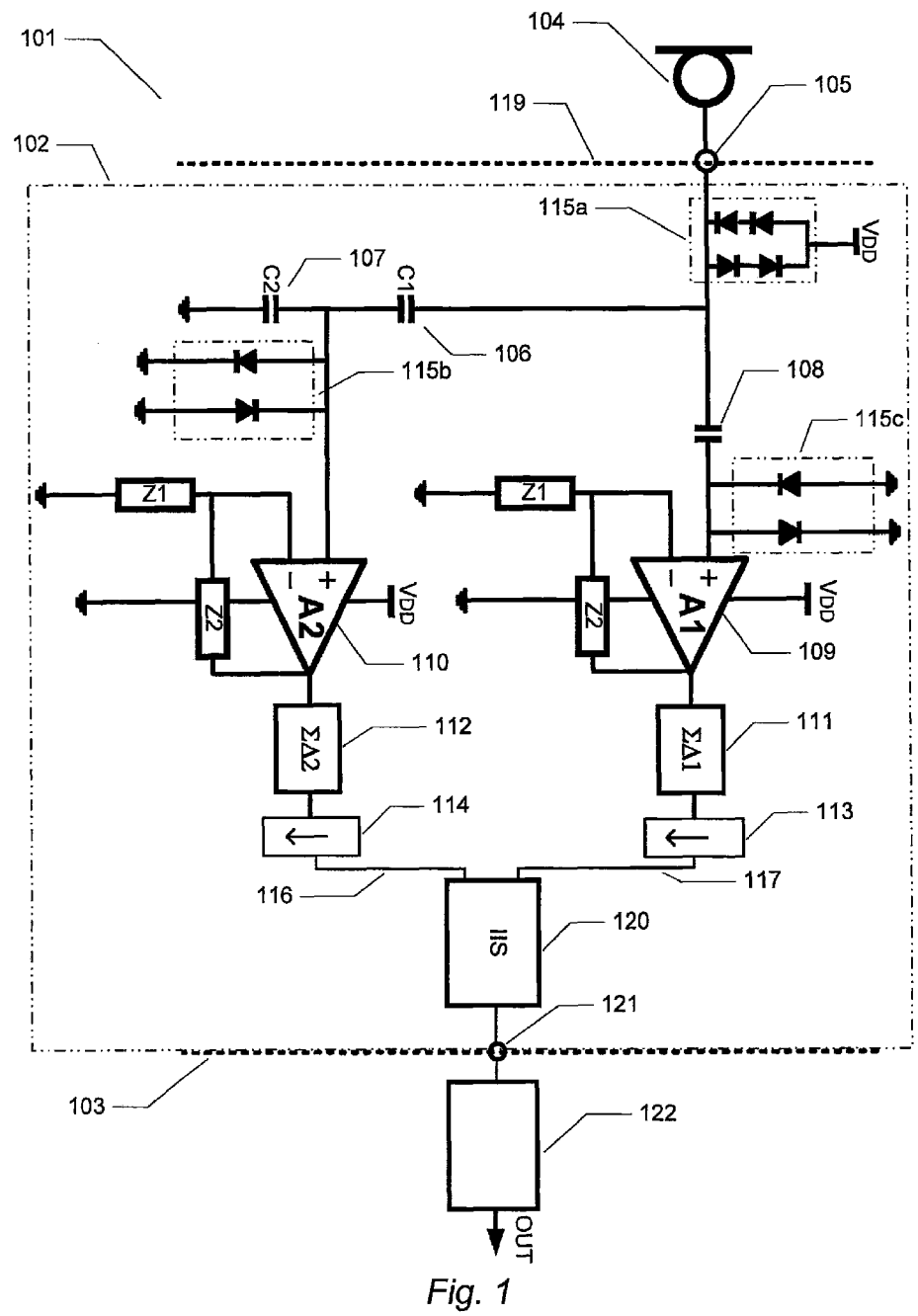
FIG. 1 is a schematic drawing of an audio amplification system comprising an audio amplification circuit and audio signal controller according to a first embodiment of the present invention, FIG. 1a) is a schematic drawing of an audio amplification circuit according to a second embodiment of the present invention.

FIG. 1 is a schematic drawing of an audio amplification system 101 which comprises two separate circuit portions in form of an audio amplification circuit 102 serving as a front-end and an audio signal controller or selection circuit 122 serving as a back-end of the audio amplification system 101. As illustrated by dotted interface line 103, the audio amplification circuit 102 and the signal controller 122 may either be fabricated or implemented on a common CMOS semiconductor die or they may be fabricated on two different CMOS semiconductor dies. In particular, the audio signal controller 122 may reside remotely for example within a portable terminal in form of an appropriately programmed or configured Digital Signal Processor (DSP) with data interface terminal(s) operatively coupled to the illustrated externally accessible output terminal 121 of the present audio amplification circuit 102 for receipt of multiplexed first and second digital audio signals or digital audio stream. In this configuration, the audio amplification circuit 102 may reside on a printed circuit board or other carrier of the portable terminal or alternatively be mounted within a miniature microphone housing of a microphone of the portable terminal.

The amplification circuit 102 is shaped and sized for integration into a miniature ECM housing and in the illustrated embodiment connected to a miniature capacitive microphone 104 through an input terminal or pad 105 of the amplification circuit 102 via conventional wire bonding techniques. The amplification circuit 102 comprises first and second preamplifiers 109, 110, respectively, which in this embodiment are implemented as non-inverting operational amplifiers, each having an audio frequency amplification controlled by the impedance ratio of two impedances Z1 and Z2. The impedances Z1 and Z2 may comprise respective resistors or capacitors setting the respective audio band voltage gains of the first and second preamplifiers 109, 110, respectively.

The first and second preamplifiers 109, 110, respectively, form part of an upper and lower signal path or channel operatively coupled to a common analogue audio input signal through input terminal 105. The upper signal path comprises a DC blocking filter formed by capacitor 108 operating to remove DC components from the input audio signal before being applied to a non-inverting input of the first preamplifier 109 (A1). In this embodiment the capacitance of the DC blocking capacitor 108 is preferably between 1 and 20 pF, more preferably about 2 pF. The lower signal path comprises two capacitors C1 106 and C2 107, coupled as a capacitive voltage divider of the audio input signal. The function of the voltage divider, is to attenuate the audio input signal to the preamplifier A2 110 of the lower signal path, by a factor given by $$V_{audio} = V_{mic} \frac{C_1}{C_2 + C_1}$$

where $V_{audio}$ is the audio input signal to the preamplifier 110 of the lower signal path and $V_{mic}$ is the audio input signal generated by a microphone transducer element of the miniature ECM microphone 104. A capacitive voltage divider comprising C1 106 and C2 107 is accordingly connected in-between the input terminal 105 and the non-inverting input of the second preamplifier 110. Sizes of the capacitances C1 and C2 are generally adapted to a generator impedance of the audio source supplying audio input signals through the input terminal 105. In the present embodiment, where the audio source is a miniature ECM 104, the value of C1 is preferably in a range between 20 and 100 fF (1 fF=$10^{-15}$ F). Preferably C2 is 2-20 times larger than C1, more preferably about 9 times larger, resulting in approximately 20 dB of signal attenuation of the input signal to the second preamplifier 110. A first pair of anti-parallel bias diodes 115c is coupled between a non-inverting input terminal of the first preamplifier 109 and GND to set an appropriate DC bias point of the first preamplifier 109. The pair of anti-parallel bias diodes 115c functions as an extremely high impedance bias circuit with an impedance of 10 GΩ or larger for small signal operation of the first preamplifier 109. The extremely high impedance minimizes loading on the signal input terminal 105 and therefore maximizes the level of the audio input signal delivered by the microphone transducer element. In addition the pair of anti-parallel bias diodes 115c functions as overload protection or signal limiting for the non-inverting input terminal of the first preamplifier A1 by limiting a peak signal input voltage to about +/−0.5 Volt which corresponds to one diode voltage drop over a single forward diode of the pair of anti-parallel bias diodes 115c. A similar pair of anti-parallel bias diodes is coupled between a non-inverting input terminal of the second preamplifier 110 and GND as well. Finally a third set of anti-parallel diodes 115a is coupled between the input terminal 105 of the audio amplification system and a positive DC power supply voltage or rail $V_{DD}$. Each leg of the third set of anti-parallel diodes 115a comprises a cascade of two, or optionally more, diodes and operates to limit a peak signal input voltage to the audio amplification system to about +/−1.0 Volt (or higher if more diodes are cascaded in each leg) which corresponds to two diode voltage drops across forward-conducing diodes.

The upper, or normal sensitivity signal path, and lower, or low sensitivity signal path, each comprises a sigma-delta analogue-to-digital converter 111 and 112, respectively, for converting analogue output signals provided at respective outputs of the first and second preamplifiers 109, 110 into corresponding first and second digital audio signals transmitted to respective decimation filters 113, 114. In one embodiment, the first and second sigma-delta analogue-to-digital converters 111 and 112, respectively, are both single-bit converters operating at an oversampled sampling rate or frequency of 2.4 MHz. In the present embodiment, each decimation filter receives a one-bit digital audio stream at the oversampled sampling rate of 2.4 MHz and down-samples this single-bit audio stream to form a decimated and lowpass filtered digital audio signal with a word length of 16 bits at a 48 kHz final sampling frequency. However the skilled person will understand that a wide range of oversampled sampling frequencies, such as between 1.0 MHz and 10 MHz, and final sampling frequencies such as between 8 kHz and 96 kHz may be used by suitable adaptation of the illustrated embodiment in accordance with requirements of a particular application.

The decimated and lowpass filtered digital audio signals are transmitted by respective data busses 116, 117 to the digital audio interface 120 operatively coupled in-between the first and second digital audio signals and the externally accessible output terminal 121. The digital audio interface 120 is configured to receive and convert the first and second digital audio signals at the 16 kHz final or Nyquist sampling rate into a digital audio stream compliant with a standardized data communication/digital audio protocol such as I²S, S/PDIF, AES/EBU, SLIMbus™.

The signal selection circuit 122 may comprise a corresponding digital audio interface (not shown) for receipt and decoding of the digital audio stream. The signal selection circuit 122 additionally comprises logic and arithmetic circuitry configured for selectively conveying or transmitting one of the first and second digital audio signals based on a level, or other signal features, of the second digital audio signal. The signal selection circuit 122 preferably comprises a software programmed microprocessor or DSP which implements functionality of the signal controller 122 by an appropriate collection of executable program instructions or subroutines.

The audio amplification system 101 is powered from the positive DC power supply voltage or rail through supply terminal $V_{DD}$. GND level acts as a negative DC power supply voltage or rail for the audio amplification system 101. In the embodiment of the invention, the audio amplification system 101 is designed for operation on DC power supply voltages between 1.2 Volt and 2.0 Volt such as about 1.8 Volt. The audio amplification system 101 preferably comprises a clock input terminal (not shown) for receipt of, and synchronization to, an externally generated system clock to allow the first and second digital audio signals transmitted from the output, OUT, of the signal controller 122 to be synchronized to the externally generated system clock.

Figure 1A:
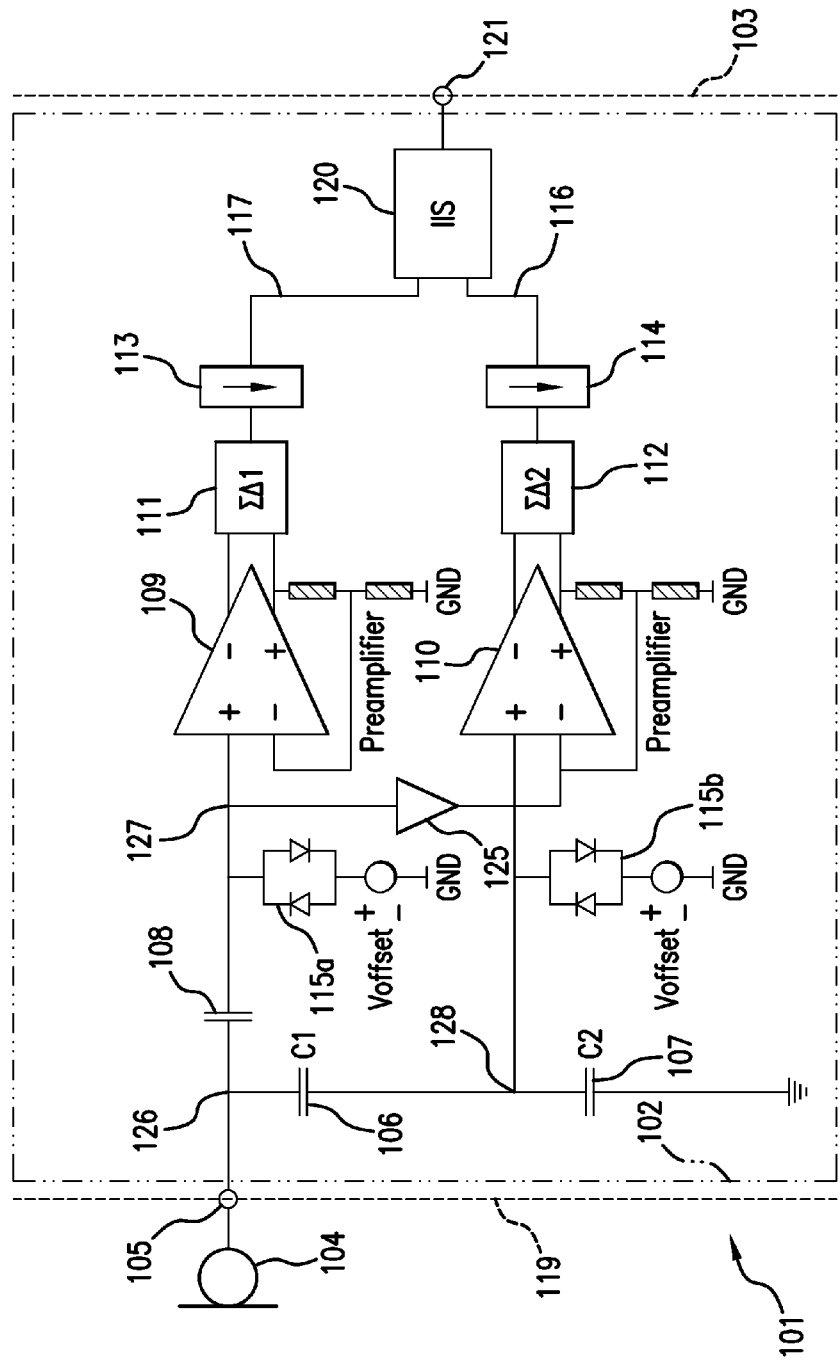

FIG. 1a) is a schematic drawing of an audio amplification circuit 102 according to another embodiment of the invention. Corresponding features in the first and second embodiments of the audio amplification circuits may have identical electrical characteristics, such as capacitance, resistance, amplification etc, and have been provided with the same reference numerals to ease comparison.

The audio amplification circuit 102 comprises first and second preamplifiers 109, 110, respectively, which in this embodiment are implemented as non-inverting operational amplifiers similar to the above-described first embodiment of the audio amplification circuit 102. The first and second preamplifiers 109, 110, respectively, form part of an upper and lower signal path or channel operatively coupled to a common analogue audio input signal through input terminal 105.

The lower signal path comprises two capacitors C1 106 and C2 107, coupled as a capacitive voltage divider of the audio input signal applied to the input terminal 105. The function of the voltage divider is to attenuate the audio input signal to the preamplifier 110 of the lower signal path, by the factor outlined above.

The present audio amplification circuit 102 comprises a non-inverting gain buffer 125 coupled between a non-inverting input 127 of the first preamplifier 109 and an inverting input of the second preamplifier 110. The gain of the non-inverting gain buffer 125 may be smaller than one, equal to one, or larger than one depending on the amount of input signal attenuation provided by the capacitive voltage divider. In the present embodiment, the gain of the non-inverting gain buffer 125 is smaller than one due to the attenuation of about 20 dB of the input signal to the second preamplifier 110. The non-inverting gain buffer 125 may comprise active devices forming a unity-gain buffer or amplifier with large input impedance and small output impedance to reduce loading of the non-inverting input 127 of the first preamplifier 109.

The non-inverting gain buffer 125 reduces signal distortion at the differential output of the preamplifier 110 of the lower signal path or channel at large input signal levels of the audio input signal. At such large input signal levels, the input signal on preamplifier 109 of the upper signal path may be severely distorted due to non-linearity of the pair of anti-parallel diodes 115a. The distorted input signal on preamplifier 109 is coupled to the input signal of the preamplifier 110 of the lower signal path by a signal path extending through coupling capacitor 108, C1 and C2. This unintended spill over effect of distortion to the non-inverting input of the preamplifier 110 is compensated by supplying a carefully adjusted corresponding amount of distortion to the inverting input of the preamplifier 110 through non-inverting gain buffer 125. When substantially equal distortion signals are applied simultaneously to the non-inverting and inverting inputs of the preamplifier 110, distortion in the differential output signal of the preamplifier 110 is substantially cancelled, or at least significantly attenuated, due to the differential amplification property of the preamplifier.

Figure 2:
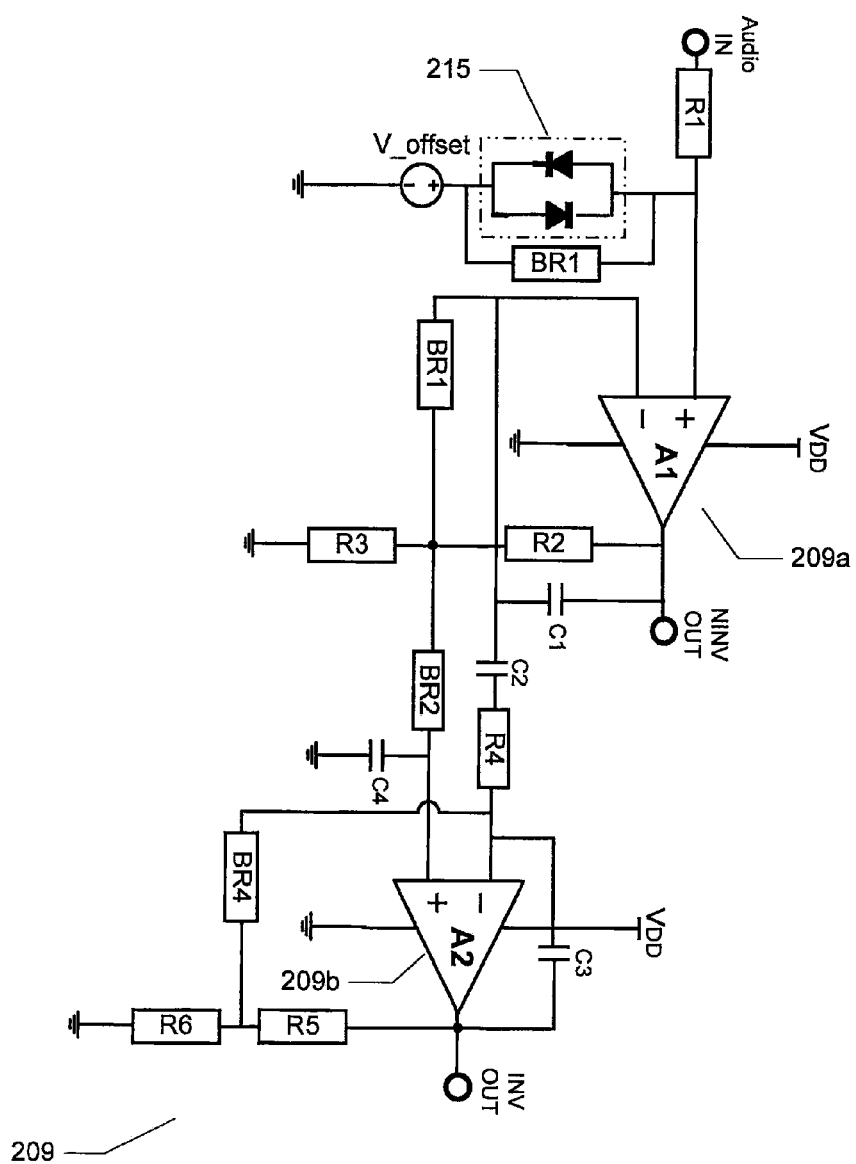
FIG. 2 is detailed block diagram of a preamplifier for an audio amplification circuit forming part of the audio amplification system depicted on FIG. 1.

FIG. 2 is a detailed block diagram of a preferred embodiment of the preamplifiers, 109, 110 depicted schematically on FIG. 1 with differential outputs.

The present preamplifier 209 is preferably used as an advantageous implementation of each of the first and second preamplifiers, 109, 110, respectively, schematically depicted on FIG. 1. The preamplifier 209 comprises first and second amplification stages, 209a and 209b, respectively, configured to convert a single-ended audio input signal at terminal Audio IN into a differential output signal on terminals NINV OUT and INV OUT. Each of the first and second amplification stages A1 and A2, 209a and 209b, respectively, comprises an operational type of differential amplifier with a PMOS input transistors for low-noise performance.

The first amplification stage, A1, 209a is configured as a non-inverting operational amplifier with AC feedback supplied to its inverting input through C1 and AC gain, i.e. audio frequency amplification, set by the ratio between C1 and C2. A DC gain is set by a ratio between R2 and R3. BR1 is a MOS transistor operating in triode-region to provide a GΩ resistance in series with the inverting input of first amplification stage 209a or A1. The second amplification stage, A2, 209b is configured as an inverting operational amplifier with AC feedback supplied to its inverting input through C3 so that the AC gain is set by the ratio between C3 and C2. C1, C2 and C3 are preferably pF-sized capacitors for example poly-poly capacitors for accurate setting of the respective AC gains of first and second amplification stages, 209a and 209b, respectively. In the present embodiment, a differential gain of the preamplifier 209, measured as the ratio between the single-ended audio input signal at terminal Audio IN and the differential output signal on terminals NINV OUT and INV OUT, is set to about 14 dB. In a preferred embodiment, C1, C2 and C3 have respective values between 1 and 20 pF so as to minimize semiconductor substrate area consumption of the preamplifier 209.

A combination of C4 and BR2, which is a MOS transistor operating in triode-region provide a large resistance, forms a lowpass filter with a cut-off frequency of about 80 to 200 kHz operating as an anti-aliasing filter for the sigma-delta analogue-to-digital converters coupled to the preamplifiers as illustrated on FIG. 1.

A pair of anti-parallel diodes 215, preferably implemented as a pair of diode-coupled PMOS transistors, is coupled to a DC offset or DC bias voltage source, V_offset to limit maximum amplitude of the audio input signal applied to the non-inverting input of the amplification stage 209a to a predetermined limiting level. Once the amplitude of the audio input signal on terminal Audio IN exceeds the DC voltage provided by V_offset by more than a threshold voltage, $V_T$, the audio input signal is effectively clamped at that voltage because one of the PMOS diodes begins to conduct and form a low-impedance path to V_offset.

Figure 3:
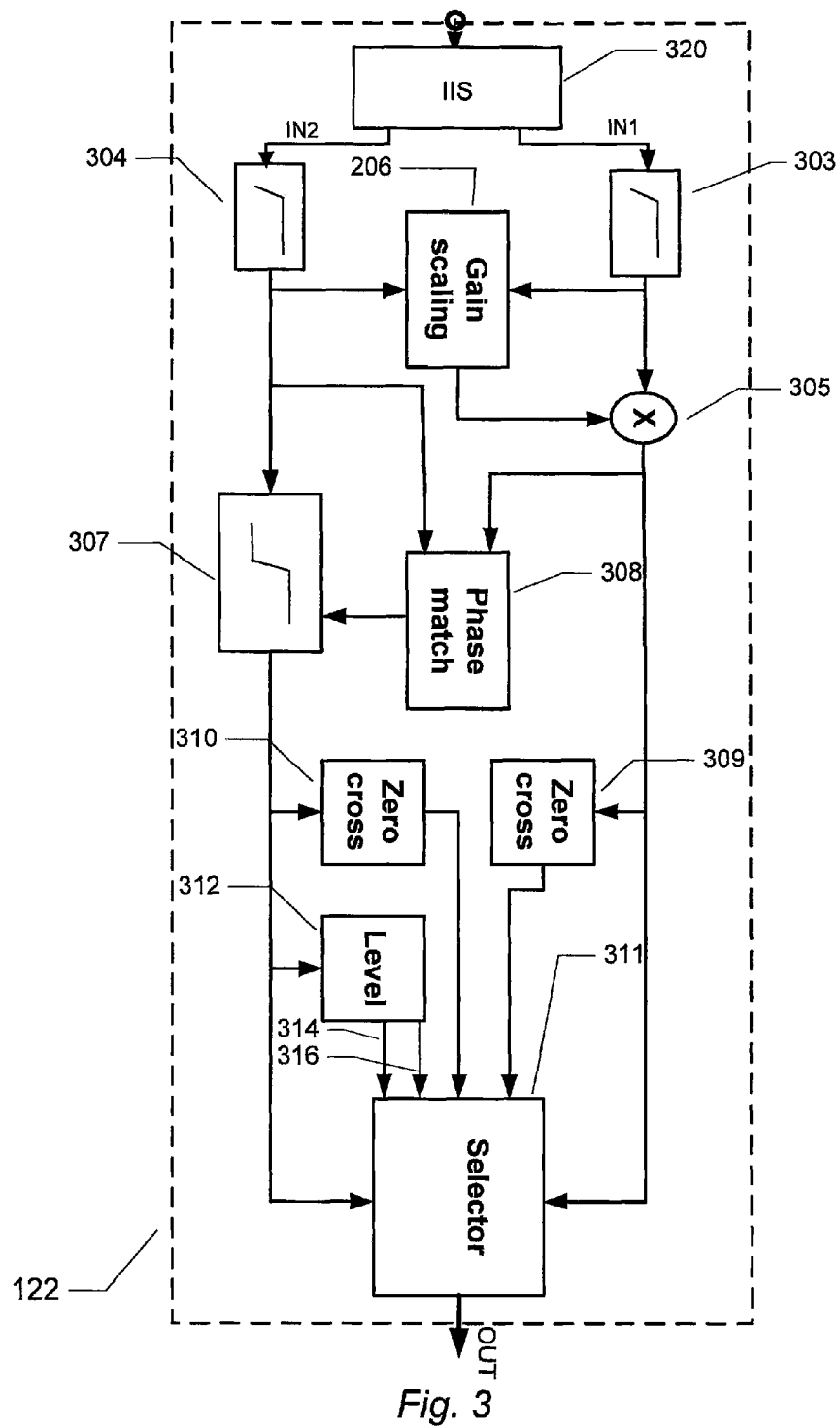
FIG. 3 is a block diagram of the audio signal controller depicted schematically on FIG. 1.

FIG. 3 is a detailed block diagram of the programmable audio signal controller or selection circuit 122 depicted on FIG. 1. The audio signal controller 122 comprises two parallel signal paths or channels extending from the respective signal inputs IN1 and IN2 to corresponding inputs of a multiplexer 211 which implements the switching between, or swapping of, the first and second digital audio signals at the controller output, OUT, of the audio signal controller 122. In the present embodiment, the signal inputs IN1 and IN2 receive the first and second digital audio signals, respectively, in decimated format the same Nyquist sampling frequency of 16 kHz. The first and second digital audio signals are provided through a standardized digital audio interface in form of the I²S interface 220 as explained above in connection with FIG. 1.

Each of the first and second digital audio signals is subsequently highpass filtered by an upper and a lower highpass filtering step 303, 304, respectively, to remove DC components. The transfer functions of the of the upper and lower highpass filter 303, 304 are preferably substantially identical to maintain a good phase matching between the upper and lower signal channels. A cut-off frequency of each of the highpass filters 303, 304 is preferably set to a frequency of about 20 Hz.

A gain scaling operation or step is applied to the first digital audio signal in the upper signal channel by a multiplier 305 controlled by gain scaling function 306. The multiplier 305 multiplies the first digital audio signal with a scaling factor provided as a preset value by the gain scaling function 306. As previously explained, the audio input signal has been attenuated by approximately 20 dB by the capacitive voltage divider formed by C1 and C2 (refer to FIG. 1) coupled to the audio input signal. The scaling factor is therefore set to a value of 0.1 in the present case to compensate for the amplification difference between the first and second signal amplifications of the associated amplification circuit 102. The first and second digital audio signals with appropriately equalized levels are thereafter transmitted to a phase matching operation or function 308 which controls a transfer function setting of a digital compensation filter 307 of the upper signal channel. The transfer function of the digital compensation filter 307 comprises a zero and a pole. The zero is located proximate in frequency to a subsonic pole of the second preamplifier set by the feedback network formed by Z2 and Z1 (refer to FIG. 1) so as to eliminate effects of this subsonic pole on the small signal transfer function of the second preamplifier. The exact position in frequency of this zero is not particularly critical and may be set to match a nominal frequency of the subsonic pole of the second preamplifier 110. The digital compensation filter 307 additionally comprises a pole matched in frequency to the lowest pole of the small signal transfer function of the first preamplifier 109. The exact frequency of this pole of the digital compensation filter 307 may be determined during a calibration step performed during manufacturing of the audio amplification system 101 and loaded into an appropriate register or memory address or location of the audio signal controller 122. Alternatively, the audio signal controller 122 may be adapted to determine an optimal location of the pole by comparing phase features of the first and second digital microphone signals transmitted to the phase matching operation or function 308. Both of these phase matching procedures can thus ensure excellent phase matching between the first and second digital audio signals. A first and a second zero-cross detector 309, 310, respectively, are adapted to monitor the first and second digital audio signals, respectively, for zero-crossing by inspecting sign-values of respective samples of these digital audio signals. The first and second digital audio signals may conveniently be represented by respective 16 or 24 bit samples in two's complement format which is compatible with many industry standard programmable DSPs. The signal selector 311 uses detected simultaneous zero-crossings of the first and second digital audio signals to switch between conveying the first or the second digital audio signal to the controller output, OUT, if certain other criteria regarding the level of the second digital audio signal are met as described below.

A level estimator 312 is adapted to detect a pair of levels estimates of the second digital audio signal and transmit these to the signal selector 311. A first level estimate is detected as running absolute peak amplitudes of the second digital audio signal for increasing levels of the second digital audio signal. A second level estimate is computed or detected with a larger time constant as a running average level provided by averaging about 100 samples of the second digital audio signal corresponding to an averaging time of about 6.25 mS at the 16 kHz sampling frequency. The signal selector 311 is configured to read or determine the first and second level estimates on a running basis and compare these with a predetermined threshold level, or optionally with one of two different threshold levels, to determine which of the first and second digital audio signals that is to be conveyed to the controller output, OUT, of the signal selector 311. The predetermined threshold level is set to a signal level which corresponds to approximately 3 dB below, such as between 2 and 6 dB below, the overload limit or level of the first signal channel of the associated amplification circuit 102 to ensure the signal selector 311 can switch state and transmit the second instead of the first digital audio signal before the first channel reaches its overload limit or level or at least shortly thereafter. The level estimation function or step and signal selection process is explained in additional detail below in connection with the description of the flowchart on FIG. 3.

Figure 4:
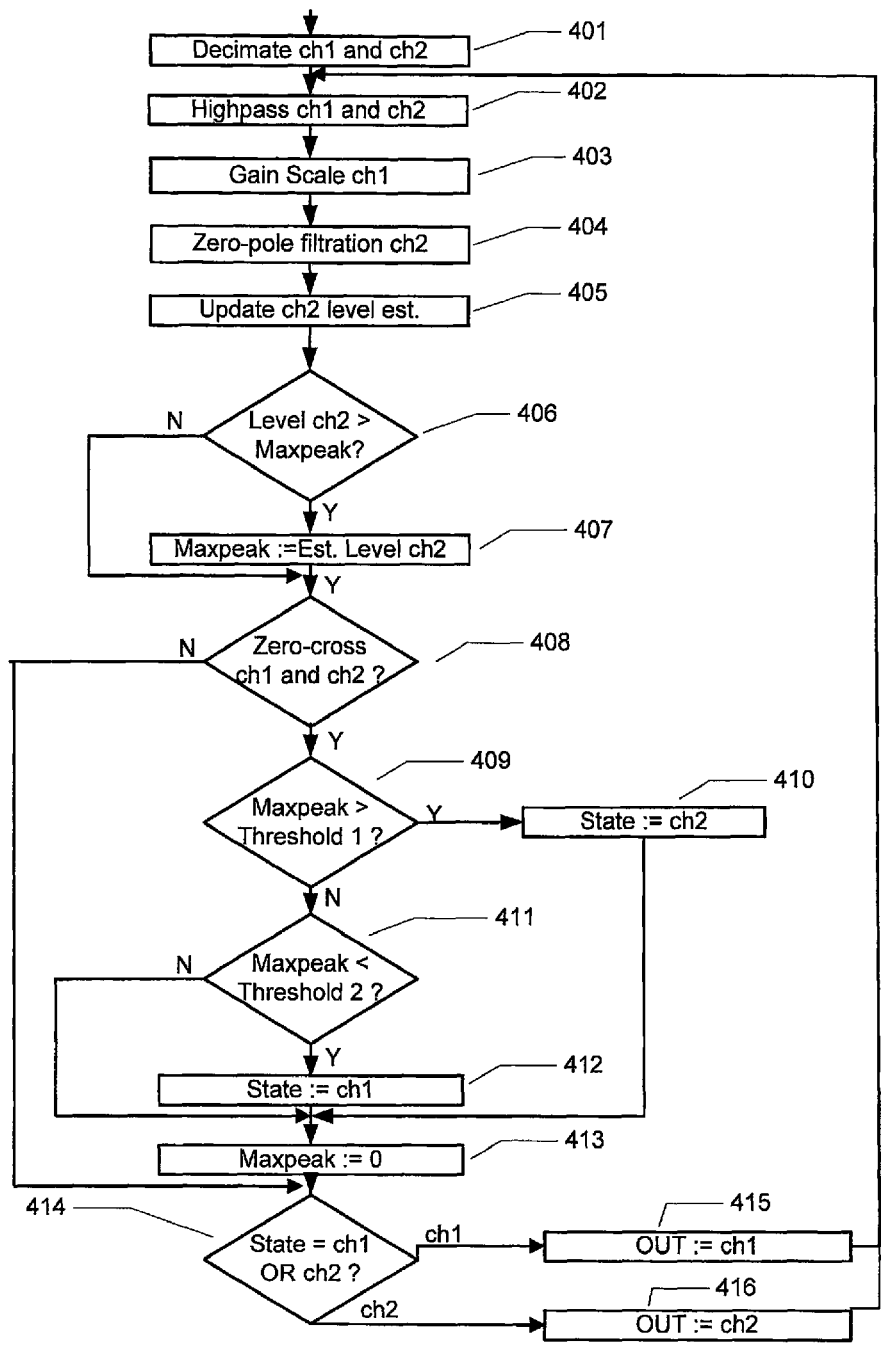
FIG. 4 is a flow-chart illustrating program or process steps executed by the audio signal controller executing the signal processing functions depicted schematically on FIG. 3.

FIG. 4 shows program steps executed by the programmable audio signal controller (122 on FIG. 1) implementing the signal processing functions depicted schematically on FIG. 2. At step 401 the first and second digital audio signals are received at the Nyquist rate from the I²S interface (220 on FIG. 2). At step and 402, both of the first and second digital audio signals are highpass filtered as previously described and at step 403 the first digital audio signal is multiplied with the previously described scaling factor to align audio signal levels of the first and second digital audio signals in the corresponding signal channels.

At step and 404, the second digital audio signal is filtered by the digital compensation filter (207 on FIG. 2) as previously described.

At step 405 one of two different updated level estimates, Yp(n), is computed. The two level estimates are derived from the second digital audio signal with different time constants by the audio signal controller 122 depending on whether the absolute amplitude of samples of the second digital audio signal is increasing or decreasing in level according to the level computing algorithm or equation below:

$$Xp(n) = ABS(x(n));$$
$$\text{If } Xp(n) > Yp(n-1)$$
$$\qquad Yp(n) = (1-A)*Xp(n) + A*Yp(n-1);$$
$$\text{else}$$
$$\qquad Yp(n) = (1-B)*Xp(n) + B*Yp(n-1);$$
$$\text{End};$$

x(n) is input to the level estimator,
Yp(n−1) is an current level estimate at an output of the level estimator,
Yp(n) is an updated level estimate at an output of the level estimator,
A<B; A and B are real numbers having respective values between 0 and 1.

In this way the value of A sets the first time constant, or attack time, of the level estimator and B sets the second time constant, or release time.

At the execution of process step 406 the updated level estimate Yp(n) is compared to a previously detected absolute peak level denoted "MaxPeak". MaxPeak is a peak tracking variable representing a maximum absolute value of the first or the second digital audio signal between a pair of consecutive zero-crossings of the first or second digital audio signal.

If the updated level estimate, Yp(n), exceeds MaxPeak the audio signal controller proceeds to step 307 where the value of Maxpeak is updated by setting it equal to the updated level estimate Yp(n). On the other hand if the updated level estimate, Yp(n), is smaller than the current MaxPeak, the audio signal controller skips process step 307 and proceeds to process step 408 so that the current value of Maxpeak remains unchanged.

The audio signal controller proceeds to execute process step 408 to monitor both of the first and second digital audio signals for detecting a substantially simultaneous zero-crossing. A zero-crossing may be determined in variety of ways for each of the first and second digital audio signals. In a preferred embodiment signs of a current signal sample and a previous signal sample of the first digital audio signal are compared and if the signs are differ a zero-crossing has been detected. The same procedure is subsequently, or has earlier been, applied to second digital audio signal. If the audio signal controller fails to detect substantially simultaneous sign changes in both of the first and second digital audio signals, the audio signal controller jumps to process step 414. In process step 414 a current setting of a state variable "State", which indicates whether the first digital audio signal supplied by the upper channel (ch1) or the second digital audio signal supplied be the lower channel (ch2) is to be transmitted to the controller output, OUT, is read. The audio signal controller sets in response the output state of the signal selector 311 to convey the digital audio signal indicated by the state variable, i.e. either the first digital audio signal supplied by ch1 or the second digital audio signal supplied by ch2.

If the audio signal controller in process step 408 on the other hand detects a substantially simultaneous zero-crossing of the first and the second digital audio signal it proceeds to process step 409 where the audio signal controller determines whether the current MaxPeak value is larger than a first predetermined threshold level "Threshold 1" which is an upper threshold level of two separate threshold levels utilized in the present embodiment of the invention. If the answer is yes (Y), the process or algorithm proceeds to process step 410 and sets the value of the state variable "State" equal to ch2 because the outcome of the previous comparison step 309 indicated that the level of the audio input signal is close to an overload limit of the upper signal channel of the associated amplification circuit (102 on FIG. 1). The audio signal controller proceeds from process step 410 to process step 413, where the value of MaxPeak is reset to zero in preparation for a new search for zero-crossings of the first and second digital audio signals. Thereafter the audio signal controller proceeds to process step 414 where the current setting of the state variable "State" is detected as ch2. In response, the audio signal controller in process step 416 subsequently selects to convey or transmit the second digital audio signal from the lower channel (ch2) to the controller output, OUT, as indicated by the current setting of the state variable.

On the other hand if the comparison between the current MaxPeak and the "Threshold 1" in process step 409 results in a no (N), the audio signal controller proceeds to step 311 where the current MaxPeak is compared to the second predetermined threshold level "Threshold 2" which is lower than "Threshold 1" preferably with an amount between 2 and 6 dB. If the comparison in process step 411 results in a no it indicates that the current value of MaxPeak lies in-between "Threshold 1" and "Threshold 2" and the audio signal controller proceeds to step 313. This means that updating the value of the state variable "State" is skipped and current state variable value therefore retained before proceeding through steps 413, 414, 415/416. On the other hand, if the current MaxPeak is lower than the second predetermined threshold level in process step 311, the audio signal controller proceeds to process step 412 and sets the value of the state variable "State" equal to ch1 because the outcome of the previous comparison step 411 indicated that the level of the audio input signal is safely below the overload limit of the upper signal channel. Accordingly, the use of two separate threshold levels, i.e. "Threshold 1" and "Threshold 2", introduces a certain amount of level based hysteresis in the output state switching to prevent rapid random switching between outputting the first and second digital audio signals.

Figure 6:
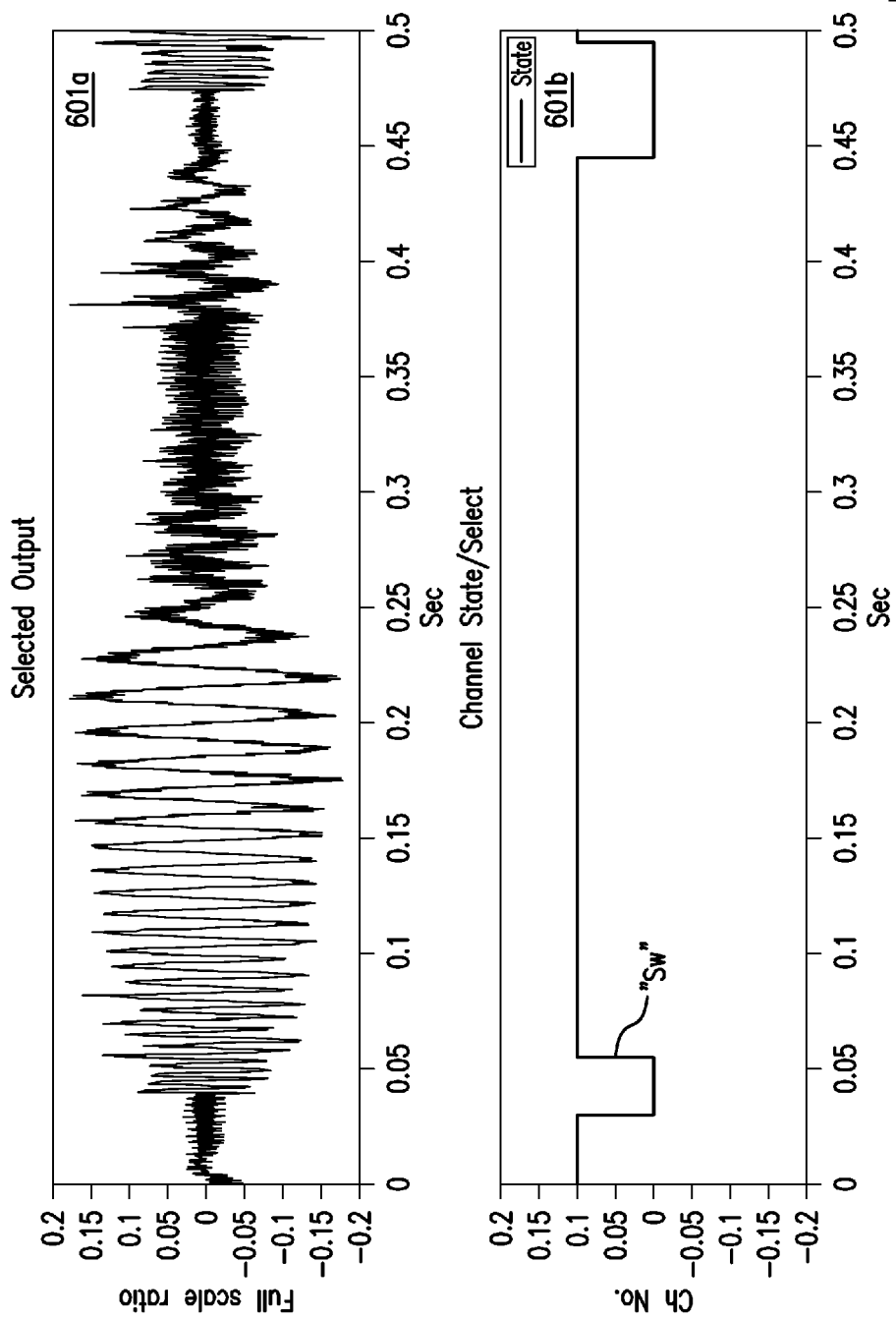
FIG. 6 shows a measured waveform of an outgoing digital audio signal at the controller output of the audio signal controller and its output state during processing of the signal waveforms depicted on FIG. 5.
Figure 7:
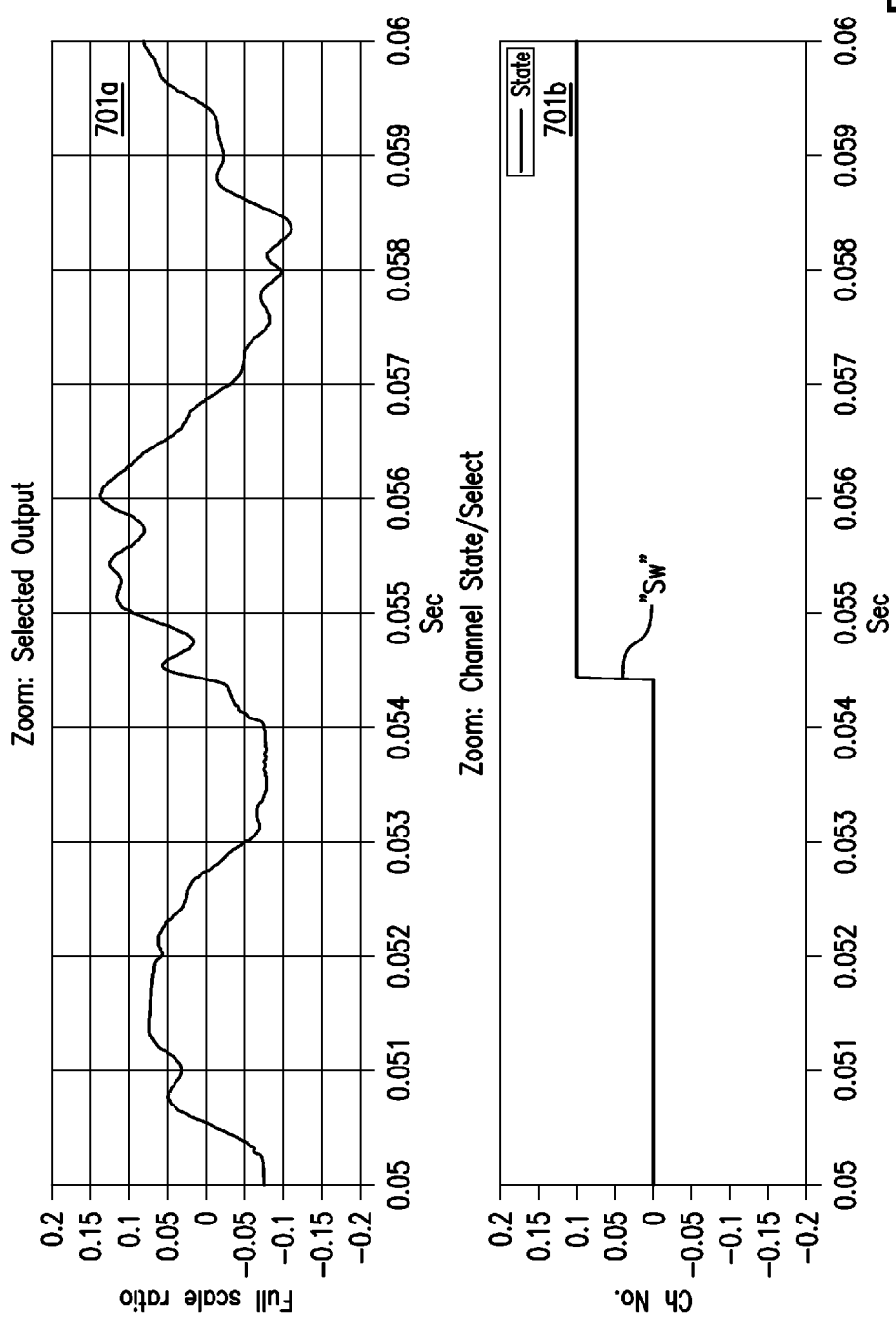
FIG. 7 is a time-zoomed plot of the measured output waveform plotted on FIG. 6 around a switch of output state of the audio signal controller.

FIG. 6 illustrates plots of measured signal waveforms of the first and second digital audio signals of the upper and lower signal channels, respectively, generated in response to a low-frequency transient sound (drum kick) applied as an analog input signal on the common input terminal 105 of the audio amplification circuit depicted on FIG. 1. The upper plot 501a shows signal amplitude over time in the upper signal channel or normal sensitivity signal channel. The unit on the time scale is seconds so each plot corresponds to a time period of about 0.5 second or 500 milliseconds. An upper threshold level in the signal selector operation or block 311 on FIG. 3 is set to a value of about 0.06 which is just below an overload limit of the upper signal channel. The upper threshold level is indicated by dotted horizontal line 503.

The illustrated signal waveforms have been captured at the respective inputs on the signal selector 311 on FIG. 3. Accordingly, both signal waveforms have been subjected to highpass filtering and the first digital audio signal of the upper signal channel has additionally been scaled by gain scaling operation (305 in FIG. 3) to equalize the level/amplitude between the first and second digital audio signals and compensate for the analog amplification difference of about 20 dB between the upper and lower signal channels introduced in the audio amplification circuit 102 of FIG. 1.

As illustrated, the audio input signal exceeds the overload or clipping limit of the upper signal channel for the first time at around t=0.45 seconds where a large negative going waveform spike projects. This point in time is marked by an "O" symbol on the lower plot 501*b*. Subsequently, the peak amplitude of the audio input signal continues to exceed the overload limit of the upper signal channel, but not the overload limit of the lower signal channel, which can be observed by noting the peak clipped waveform shape of the first digital audio signal in comparison with the unclipped waveform of the second digital audio signal in the lower plot 501*b*.

Figure 5:
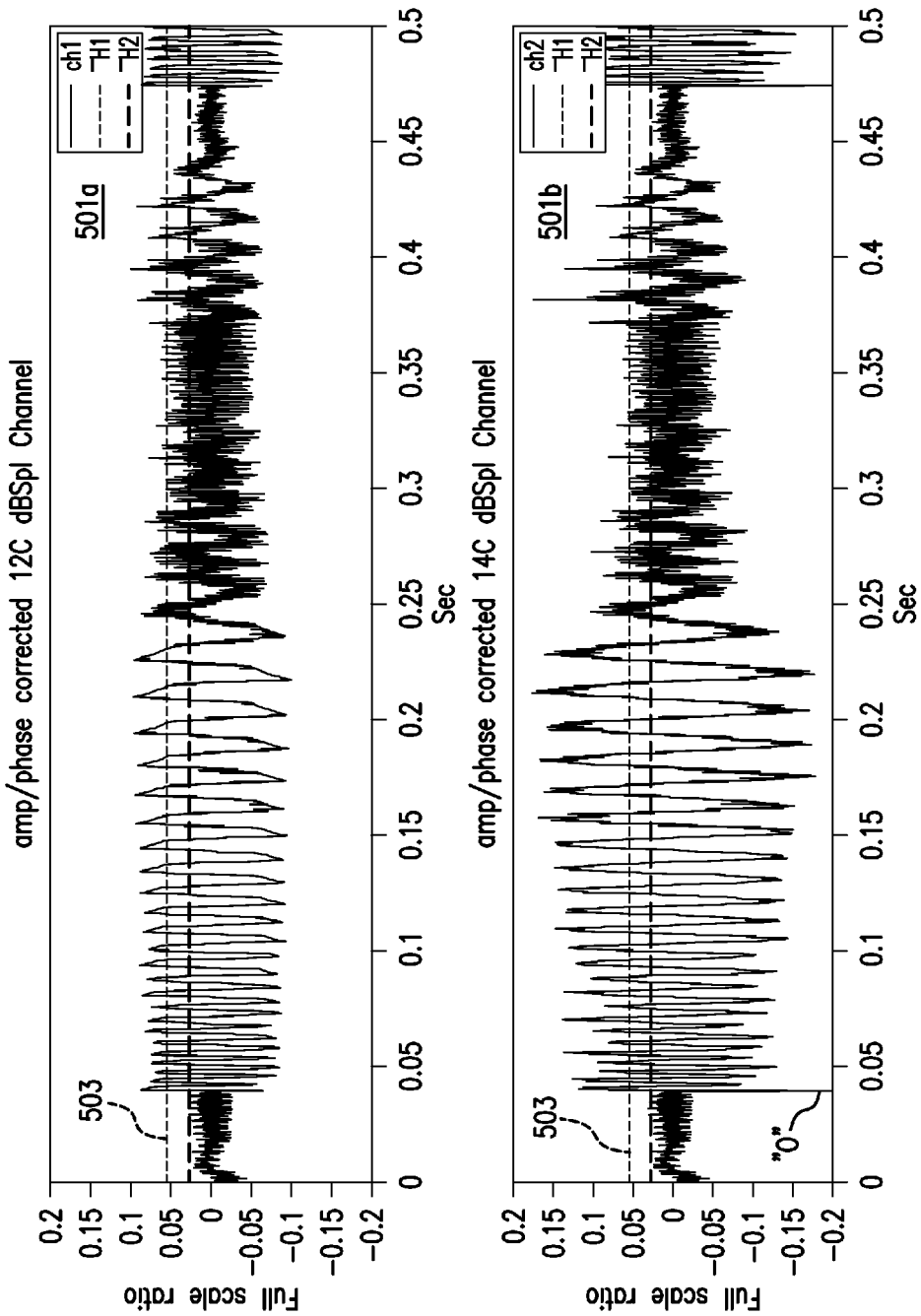
FIG. 5 shows measured signal waveforms of first and second digital audio signals generated by normal and low sensitivity signal channels of the audio signal controller depicted on FIG. 3.

The upper plot 601*a* of FIG. 6 shows a measured signal waveform of the outgoing digital audio signal at the controller output, OUT, of the audio signal controller 122 depicted on FIG. 2 in response to application of the first and second digital audio signal waveforms plotted on FIG. 5. The lower plot 601*b* of FIG. 6 shows an accompanying value of a state variable indicating the output state of the audio signal controller, i.e. whether the first or the second digital audio signal is transmitted to the controller output, OUT. A value of zero indicates that the first digital audio signal of the upper or normal sensitivity channel is transmitted to the controller output while a value of 0.1 indicates that the second digital audio signal of the lower or low sensitivity channel is transmitted to the controller output. In the present embodiment, the audio signal controller 122 is configured to firstly compare the peak absolute amplitude of the second digital audio signal with the predetermined threshold level of 0.06. Once the predetermined threshold level is exceeded, the audio signal controller 122 detects whether a simultaneous zero-crossing of the first and second digital audio signals has taken place. In the present instance, the audio signal controller 122 detected that the negative going waveform spike marked by an "O" symbol was not immediately followed by a simultaneous zero-crossing despite several zero-crossing of either of the first and second digital audio signals. Therefore no instantaneous switch of output state is carried out by the audio signal controller at the first subsequent zero-crossing. At t=0.055 seconds, the first simultaneous zero-crossing is detected following the negative going waveform spike marked by the "O" symbol as indicated by a rising state transition at the "Sw" symbol in the lower plot 601*b* of the state variable value. Hence, the constraint of having a simultaneous zero-crossing of the first and second digital audio signals may lead to a slight delay in the output state transition or switch between the first and second digital audio signals allowing for a short period of peak clipping as in the present case. However, the inventors have found this acceptable in exchange for minimizing waveform error energy at the switch point (caused by both the first and second digital audio signal being zero) in so far as these short periods of peak clipping are shorter than 10-20 milliseconds.

In FIG. 6, the upper waveform plot 701*a* shows a measured waveform of the outgoing digital audio signal transmitted at the controller output around the output state transition point marked by the "Sw" symbol in the lower plot 601*b* of FIG. 6. The lower waveform plot 701*b* shows the state variable value over time. The time scale is expanded or zoomed on both plots compared to the time axis of FIGS. 5 and 6 so as to display a 10 millisecond time period only to enhance possible waveform artifacts at the output state transition "Sw" or switch point between the first and second digital audio signal. As illustrated, the measured waveform of the outgoing digital audio signal is remarkably smooth and continuous throughout the time period surrounding the output state transition indicating absence of DC shifts and phase or amplitude misalignment between the first and second digital audio signals.

The invention claimed is:

1. An audio amplification circuit comprising:
   an input terminal for receipt of an audio input signal,
   a first preamplifier having an input operatively coupled to the input terminal and an output operatively coupled to a first analogue-to-digital converter to provide a first digital audio signal with a first signal amplification,
   a second preamplifier having an input and an output operatively coupled to a second analogue-to-digital converter to provide a second digital audio signal with a second signal amplification, and
   an attenuator, comprising a capacitive voltage divider, operatively coupled in-between the input terminal and the input of the second preamplifier, and responsive to the audio input signal, the attenuator operable to substantially attenuate the audio input signal to the second preamplifier thereby allowing the second analogue-to-digital converter to be capable of handling higher levels of the audio input signal without distortion,
   wherein the second signal amplification is smaller than the first signal amplification,
   wherein each of the first and second preamplifiers have an audio frequency amplification controlled by an impedance ratio of two impedances,
   further wherein the audio amplification circuit is formed on a substrate.

2. The audio amplification circuit according to claim 1, wherein a capacitive component of an input impedance at the input terminal is smaller than 500 fF measured at 1 kHz.

3. The audio amplification circuit according to claim 1, wherein an input impedance at the input terminal is larger than 100 MΩ measured at 1 kHz.

4. The audio amplification circuit according to claim 1, wherein the second signal amplification is at least 10 dB smaller than the first signal amplification throughout a frequency range between 300 Hz and 3 kHz.

5. The audio amplification circuit according to claim 1, wherein the second signal amplification is at least 20 dB smaller than the first signal amplification measured at 1 kHz.

6. The audio amplification circuit according to claim 1, wherein the second preamplifier and the first preamplifier have substantially identical small signal transfer functions throughout a frequency range between 100 Hz and 10 kHz.

7. The audio amplification circuit according to claim 1, wherein a small signal transfer function of the second preamplifier comprises a pole at a lower frequency than a lowest pole frequency than a lowest pole frequency of the small signal transfer function of the first preamplifier.

8. The audio amplification circuit according to claim 1, wherein a phase difference between respective small signal transfer functions of the first and second preamplifiers is less than either
   15 degrees at 1 kHz or
   10 degrees at 100 Hz.

9. The audio amplification circuit according to claim 1, wherein a gain of the second preamplifier is at least 10 dB smaller than a gain of the first preamplifier measured at 1 kHz.

10. The audio amplification circuit according to claim 1, comprising two or more cascaded non-linear elements operatively coupled between the input terminal and a DC potential comprising at least one of a DC power supply rail and a DC reference voltage to clamp the audio input signal at a first limiting level.

11. The audio amplification circuit according to claim 10, comprising a one or more cascaded non-linear elements coupled to an input of the first preamplifier to clamp an input signal at the first preamplifier input at a first preamplifier limiting level;
wherein the first limiting level is larger than the first preamplifier limiting level.

12. The audio amplification circuit according to claim 1, wherein,
the first and second analogue-to-digital converters comprise respective sigma-delta converters adapted to generate the first and second digital audio signals, respectively, at respective oversampled sampling rates.

13. The audio amplification system according to claim 12, further comprising:
a first decimation filter configured for receipt and downsampling of the first digital audio signal from a first oversampled sampling rate to a final or Nyquist sampling rate,
a second decimation filter configured for receipt and downsampling of the second digital audio signal from a second oversampled sampling rate to a final or Nyquist sampling rate.

14. The audio amplification circuit according to claim 13, comprising a digital audio interface operatively coupled in-between the first and second digital audio signals and the externally accessible output terminal or terminals,
the digital audio interface being configured to convert the first and second digital audio signals at the final or Nyquist sampling rate into a digital audio stream compliant with a standardized data communication or digital audio protocol.

15. The audio amplification circuit according to claim 1, comprising first and second externally accessible output terminals operatively coupled to the first and second digital audio signals, respectively.

16. The audio amplification circuit according to claim 1, comprising an externally accessible output terminal adapted to provide a time-multiplexed digital audio stream comprising the first and second digital audio signals.

17. The audio amplification circuit according to claim 1, comprising a clock input terminal for receipt of an external clock signal,
wherein respective sampling frequencies of the first and second analogue-to-digital converters are set by an internal clock signal of the audio amplification circuit derived from the external clock signal.

18. The audio amplification circuit according to claim 17, wherein the first and second digital audio signals are transmitted synchronously to the external clock signal via one or more externally accessible output terminals.

19. The audio amplification circuit according to claim 1, comprising a digital signal scaling function adapted to:
scaling the first or second digital audio signal with a preset or adaptive gain factor to compensate for an amplification difference between the first and second signal amplifications.

20. The audio amplification circuit according to claim 1, wherein the first preamplifier or the second preamplifier comprises:
a differential amplifier having a non-inverting input operatively coupled to the input terminal for receipt of the audio input signal,
a feedback network coupled between an output an inverting input of the differential amplifier.

21. The audio amplification circuit according to claim 20, wherein the feedback network is configured to provide a lowpass transfer function from the output of the differential amplifier to the inverting input of the differential amplifier.

22. The audio amplification circuit according to claim 1, wherein the audio amplification circuit is a part of a miniature capacitive microphone, comprising:
a capacitive transducer element responsive to impinging sound to generate a corresponding transducer signal on a transducer signal terminal,
wherein the semiconductor die or substrate is operatively coupled to the transducer signal terminal via the input terminal for receipt and amplification of the transducer signal.

23. The audio amplification circuit according to claim 1, wherein the first and second preamplifers each have a first and second differential input.

24. The audio amplification circuit according to claim 1, wherein impedances of each of the first and second preamplifiers set respective amplifications of the first and second preamplifiers.

25. The audio amplification circuit according to claim 1, wherein the impedances of each of the first and second preamplifiers comprise respective resistors or capacitors.

26. A method of amplifying audio signals comprising:
receiving an analogue audio input signal at an input terminal of an amplification circuit;
applying the analogue audio input signal to an input of a first preamplifier;
generating a first amplified output signal by the first preamplifier having a first signal amplification;
converting the first amplified output signal to a first digital audio signal;
substantially attenuating the analogue audio input signal with a predetermined amount;
applying the attenuated analogue audio signal to an input of a second preamplifier, the attenuating being performed in-between the input terminal and the input of the second preamplifier; and
generating a second amplified audio signal by the second preamplifier having a second signal amplification, wherein the second signal amplification is smaller than the first signal amplification and substantially attenuating the audio input signal to the second preamplifier allows for processing of higher levels of the audio input signal without distortion,
wherein each of the first and second preamplifiers have an audio frequency amplification controlled by an impedance ratio of two impedances,
wherein the amplification circuit is formed on a substrate.

27. The method of amplifying audio signals according to claim 26, comprising a further step of:
clamping the analogue audio input signal at a first limiting level by a cascade of two or more non-linear elements, such as diodes or diode-coupled transistors, operatively coupled between the input terminal and a DC potential comprising at least one of a DC power supply rail and a DC reference voltage.

28. The method of amplifying audio signals according to claim 26, wherein the first and second preamplifers are each non-inverting operational amplifiers.

29. The method of amplifying audio signals according to claim 26, wherein the first and second preamplifers each have a first and second differential input.

30. The method of amplifying audio signals according to claim 26, wherein impedances of each of the first and second preamplifiers set respective amplifications of the first and second preamplifiers.

31. The method of amplifying audio signals according to claim 30, wherein the impedances of each of the first and second preamplifiers comprise respective resistors or capacitors.

* * * * *